(12) United States Patent
Nishikawa et al.

(10) Patent No.: US 10,741,576 B2
(45) Date of Patent: Aug. 11, 2020

(54) THREE-DIMENSIONAL MEMORY DEVICE CONTAINING DRAIN-SELECT-LEVEL AIR GAP AND METHODS OF MAKING THE SAME

(71) Applicant: SANDISK TECHNOLOGIES LLC, Addison, TX (US)

(72) Inventors: Masatoshi Nishikawa, Nagoya (JP); Akio Nishida, Nagoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/136,686

(22) Filed: Sep. 20, 2018

(65) Prior Publication Data

US 2020/0058673 A1    Feb. 20, 2020

Related U.S. Application Data

(60) Provisional application No. 62/719,893, filed on Aug. 20, 2018.

(51) Int. Cl.
*H01L 27/11582* (2017.01)
*H01L 27/1157* (2017.01)
(Continued)

(52) U.S. Cl.
CPC .. *H01L 27/11582* (2013.01); *H01L 21/76829* (2013.01); *H01L 27/1157* (2013.01); *H01L 27/11565* (2013.01); *H01L 27/11573* (2013.01); *H01L 29/0649* (2013.01); *H01L 29/4234* (2013.01); *H01L 27/11519* (2013.01); *H01L 27/11524* (2013.01); *H01L 27/11526* (2013.01); *H01L 27/11556* (2013.01)

(58) Field of Classification Search
None
See application file for complete search history.

(56) References Cited

U.S. PATENT DOCUMENTS 5,915,167 A     6/1999   Leedy
8,349,681 B2    1/2013   Alsmeier et al.
(Continued)

FOREIGN PATENT DOCUMENTS

KR     1020130044711 A    5/2013

OTHER PUBLICATIONS

U.S. Appl. No. 15/704,286, filed Sep. 14, 2017, SanDisk Technologies LLC.
(Continued)

*Primary Examiner* — Chandra Chaudhari
(74) *Attorney, Agent, or Firm* — The Marbury Law Group, PLLC

(57) ABSTRACT

A three-dimensional memory device includes an alternating stack of insulating layers and word lines located over a substrate, memory stack structures extending through the alternating stack and containing a respective vertical semiconductor channel and a respective memory film, drain select gate electrodes located over the alternating stack, extending along a first horizontal direction, and laterally spaced apart along a second horizontal direction, and a dielectric cap layer located between adjacent drain select gate electrodes. An air gap is located between adjacent drain select gate electrodes in the dielectric cap layer.

10 Claims, 40 Drawing Sheets

(51) Int. Cl.
*H01L 27/11573* (2017.01)
*H01L 27/11565* (2017.01)
*H01L 21/768* (2006.01)
*H01L 29/06* (2006.01)
*H01L 29/423* (2006.01)
*H01L 27/11519* (2017.01)
*H01L 27/11556* (2017.01)
*H01L 27/11524* (2017.01)
*H01L 27/11526* (2017.01)

(56) References Cited

U.S. PATENT DOCUMENTS

| | | | |
|---|---|---|---|
| 8,658,499 B2 | 5/2014 | Makala et al. | |
| 8,847,302 B2 | 9/2014 | Alsmeier et al. | |
| 9,252,151 B2 | 2/2016 | Chien et al. | |
| 9,356,031 B2 | 5/2016 | Lee et al. | |
| 9,397,093 B2 | 7/2016 | Makala et al. | |
| 9,419,012 B1 | 8/2016 | Shimabukuro et al. | |
| 9,449,982 B2 | 9/2016 | Lu et al. | |
| 9,484,250 B2 * | 11/2016 | Leobandung | H01L 21/7682 |
| 9,515,085 B2 | 12/2016 | Rabkin et al. | |
| 9,576,975 B2 | 2/2017 | Zhang et al. | |
| 9,627,399 B2 | 4/2017 | Kanakamedala et al. | |
| 9,646,975 B2 | 5/2017 | Peri et al. | |
| 9,666,533 B1 * | 5/2017 | Basker | H01L 21/76897 |
| 9,691,884 B2 | 6/2017 | Makala et al. | |
| 9,842,907 B2 | 12/2017 | Makala et al. | |
| 9,875,929 B1 | 1/2018 | Shukla et al. | |
| 10,050,054 B2 | 8/2018 | Zhang et al. | |
| 2015/0008503 A1 | 1/2015 | Makala et al. | |
| 2017/0103990 A1 | 4/2017 | Kim | |
| 2017/0243879 A1 | 8/2017 | Yu et al. | |
| 2017/0352673 A1 | 12/2017 | Lee | |
| 2018/0033646 A1 | 2/2018 | Sharangpani et al. | |
| 2018/0097009 A1 | 4/2018 | Zhang et al. | |
| 2018/0211970 A1 | 7/2018 | Kai et al. | |

OTHER PUBLICATIONS

U.S. Appl. No. 15/784,549, filed Oct. 16, 2017, SanDisk Technologies LLC.
U.S. Appl. No. 15/818,061, filed Nov. 20, 2017, SanDisk Technologies LLC.
U.S. Appl. No. 15/818,146, filed Nov. 20, 2017, SanDisk Technologies LLC.
U.S. Appl. No. 15/834,261, filed Dec. 7, 2017, SanDisk Technologies LLC.
U.S. Appl. No. 15/865,892, filed Jan. 9, 2018, SanDisk Technologies LLC.
U.S. Appl. No. 15/892,228, filed Feb. 8, 2018, SanDisk Technologies LLC.
U.S. Appl. No. 15/898,571, filed Feb. 17, 2018, SanDisk Technologies LLC.
U.S. Appl. No. 15/902,169, filed Feb. 22, 2018, SanDisk Technologies LLC.
U.S. Appl. No. 15/909,036, filed Mar. 1, 2018, SanDisk Technologies LLC.
U.S. Appl. No. 15/924,944, filed Mar. 19, 2018, SanDisk Technologies LLC.
U.S. Appl. No. 16/019,821, filed Jun. 27, 2018, SanDisk Technologies LLC.
U.S. Appl. No. 16/019,856, filed Jun. 27, 2018, SanDisk Technologies LLC.
U.S. Appl. No. 16/024,048, filed Jun. 29, 2018, SanDisk Technologies LLC.
Notification of Transmittal of the International Search Report and Written Opinion of the International Search Authority for International Patent Application No. PCT/US2019/032174, dated Sep. 6, 2019, 11 pages.

* cited by examiner

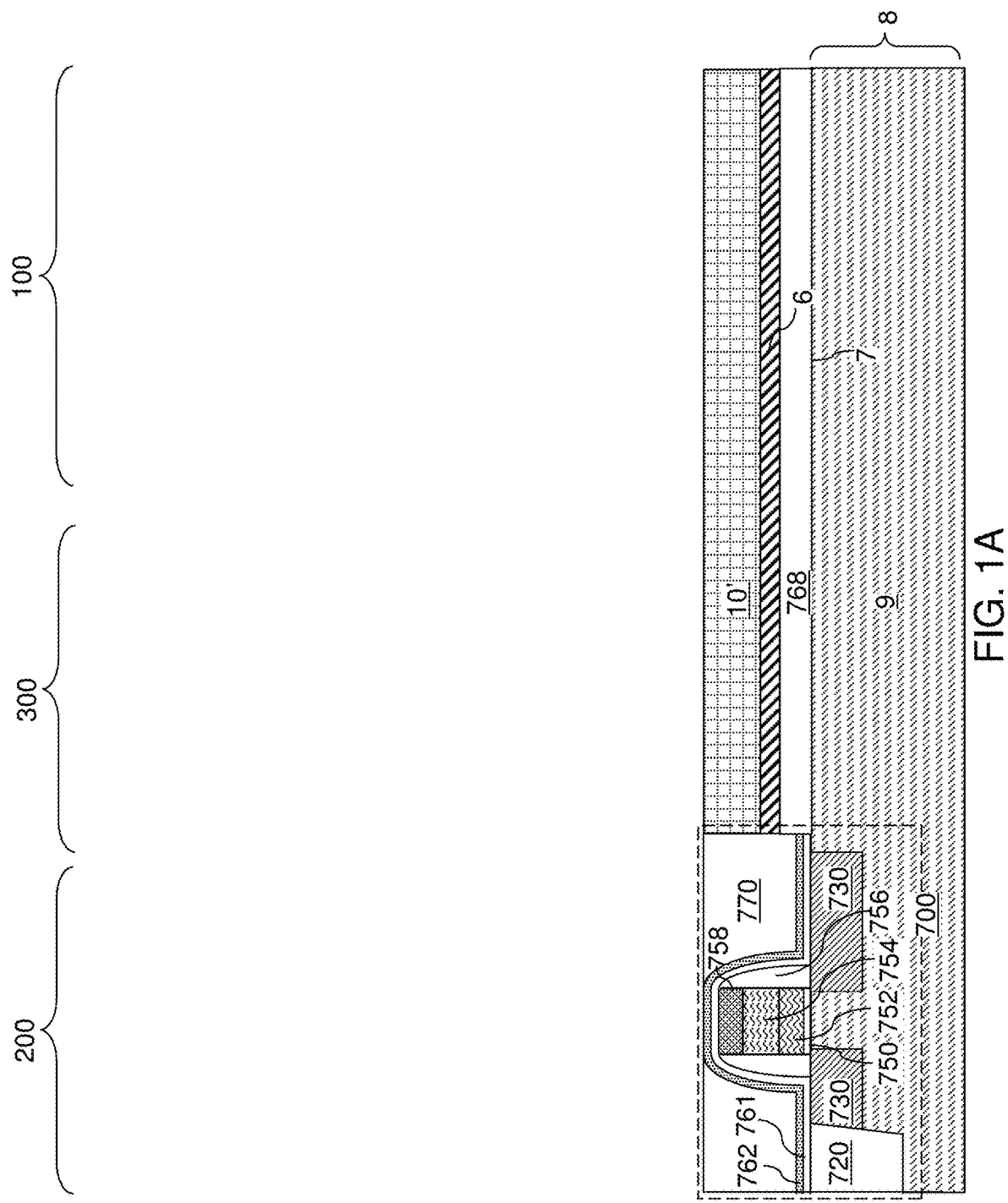

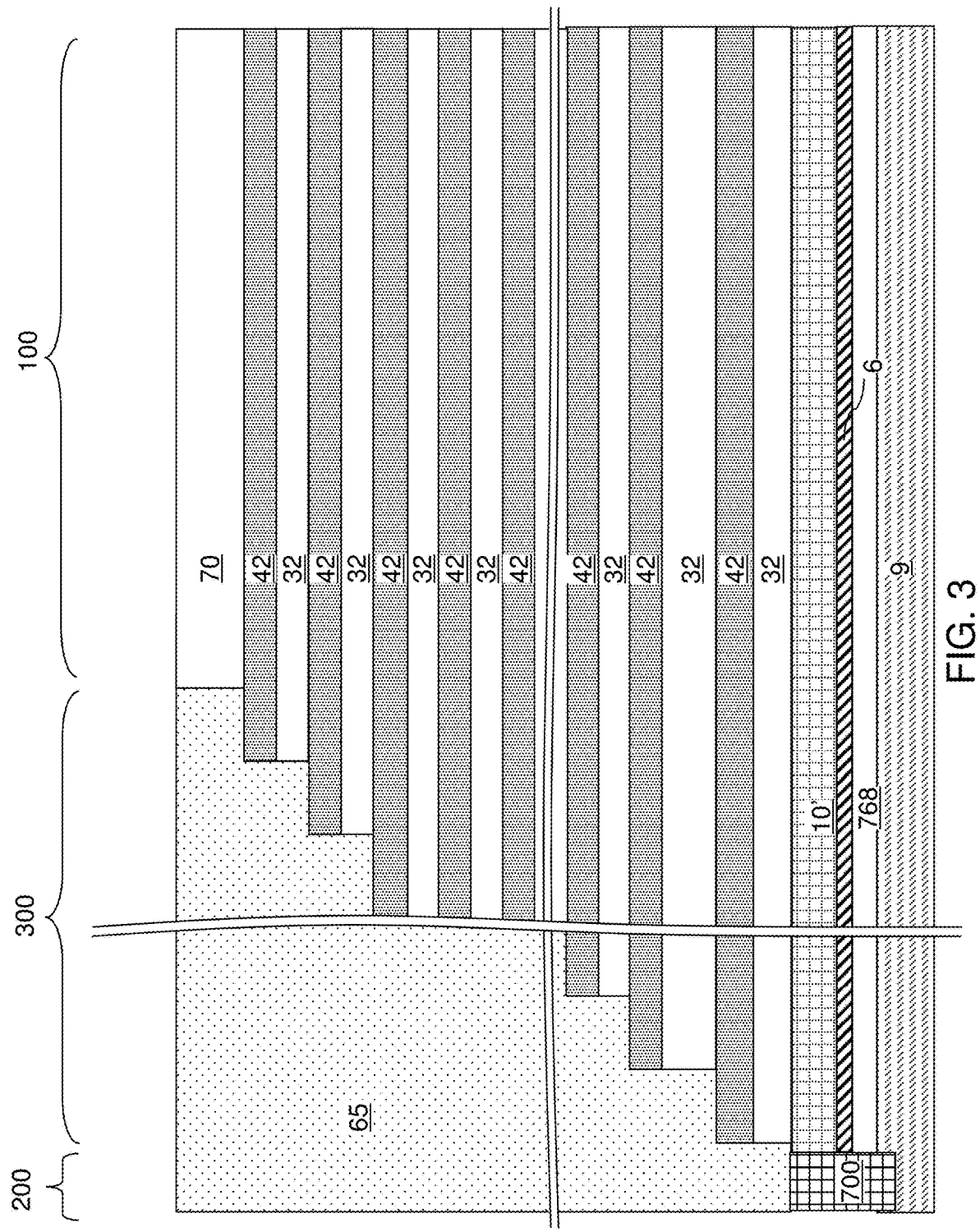

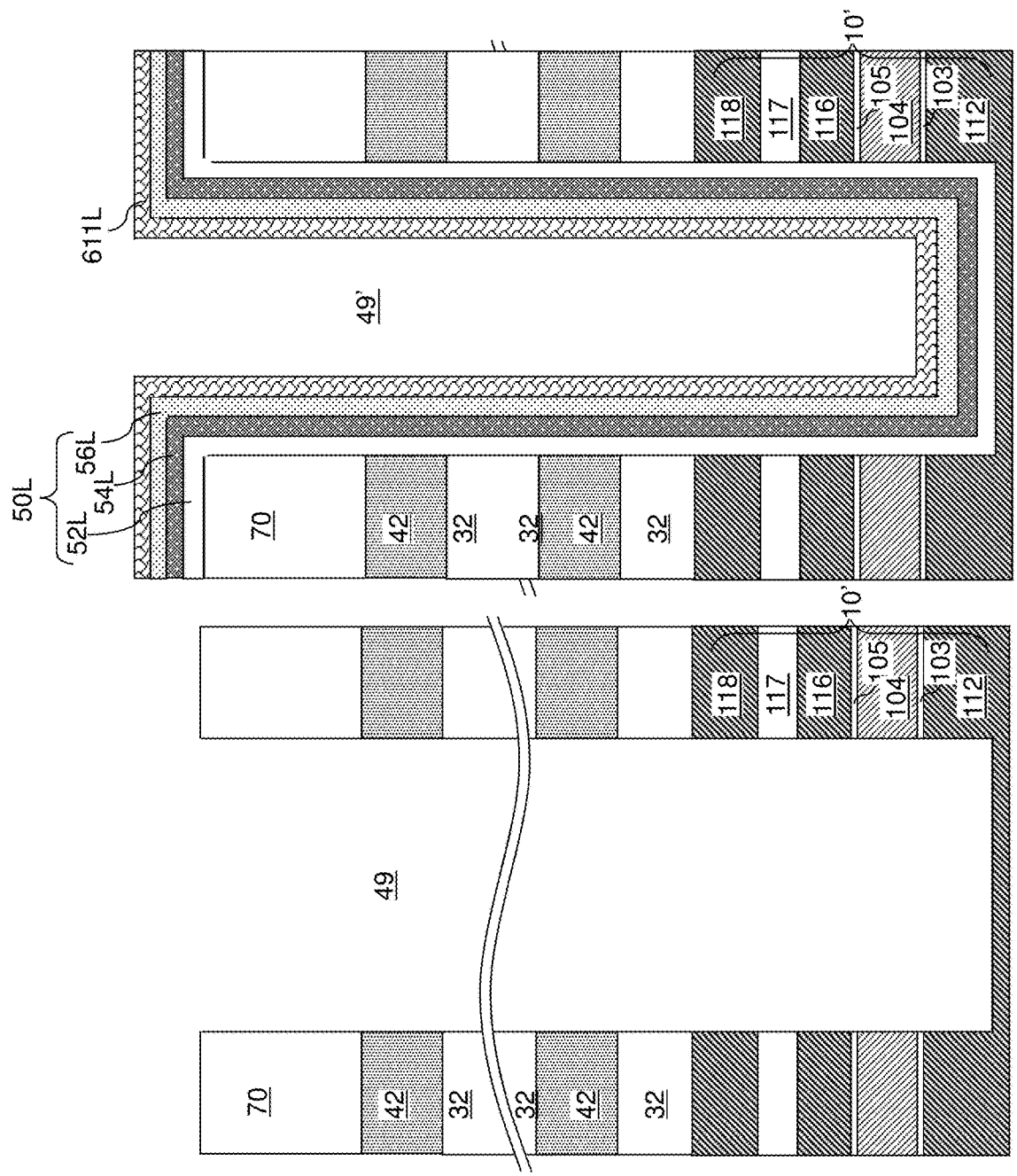

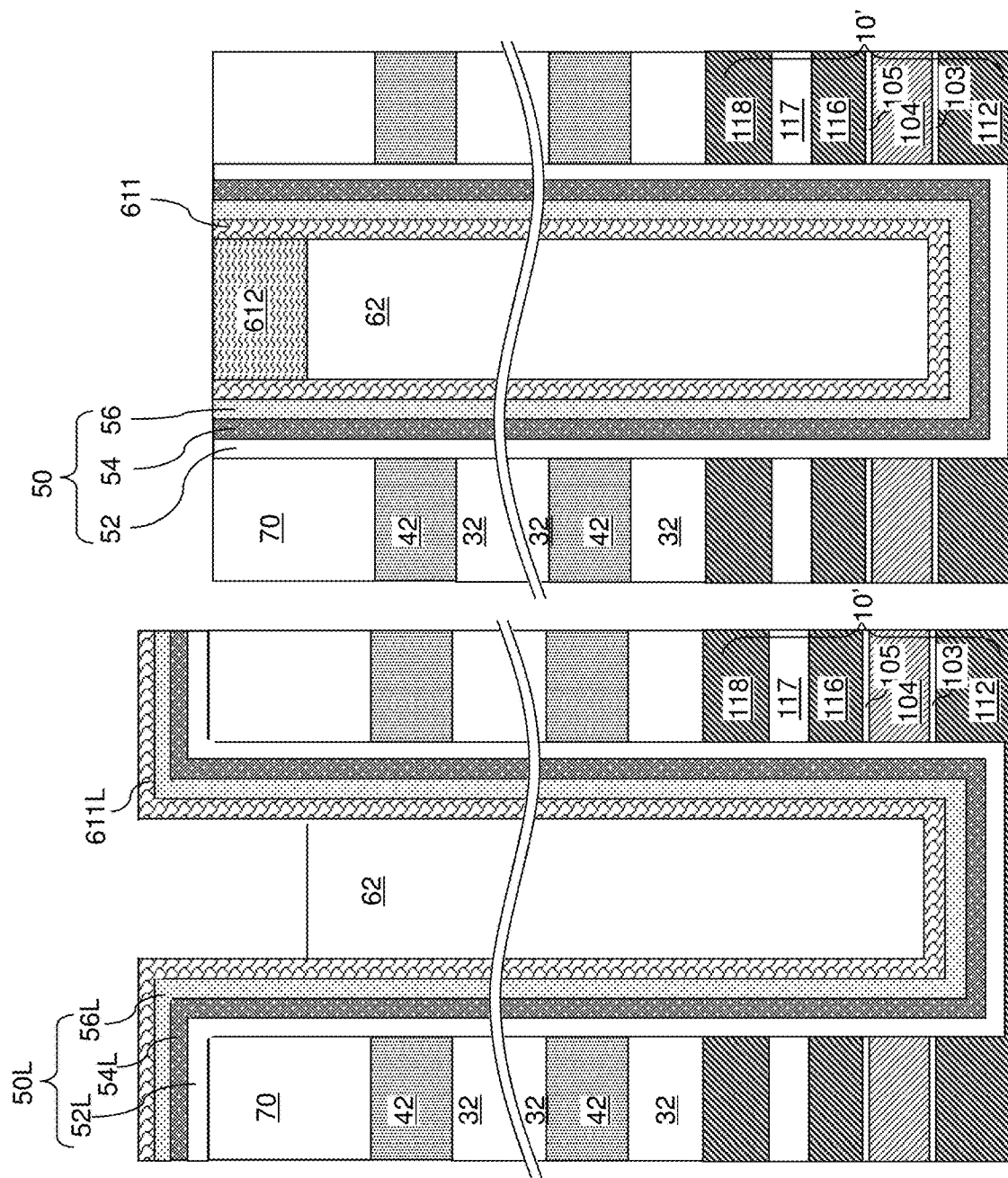

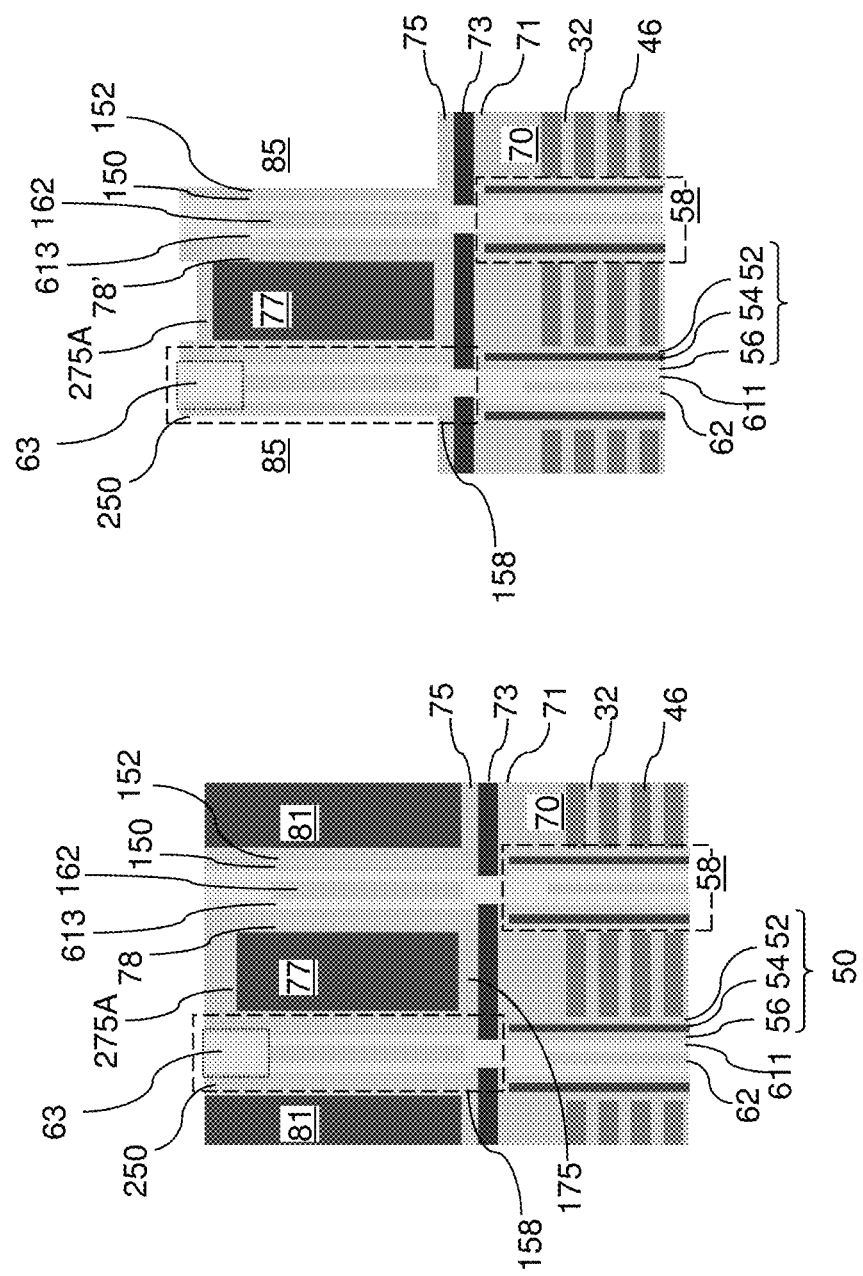

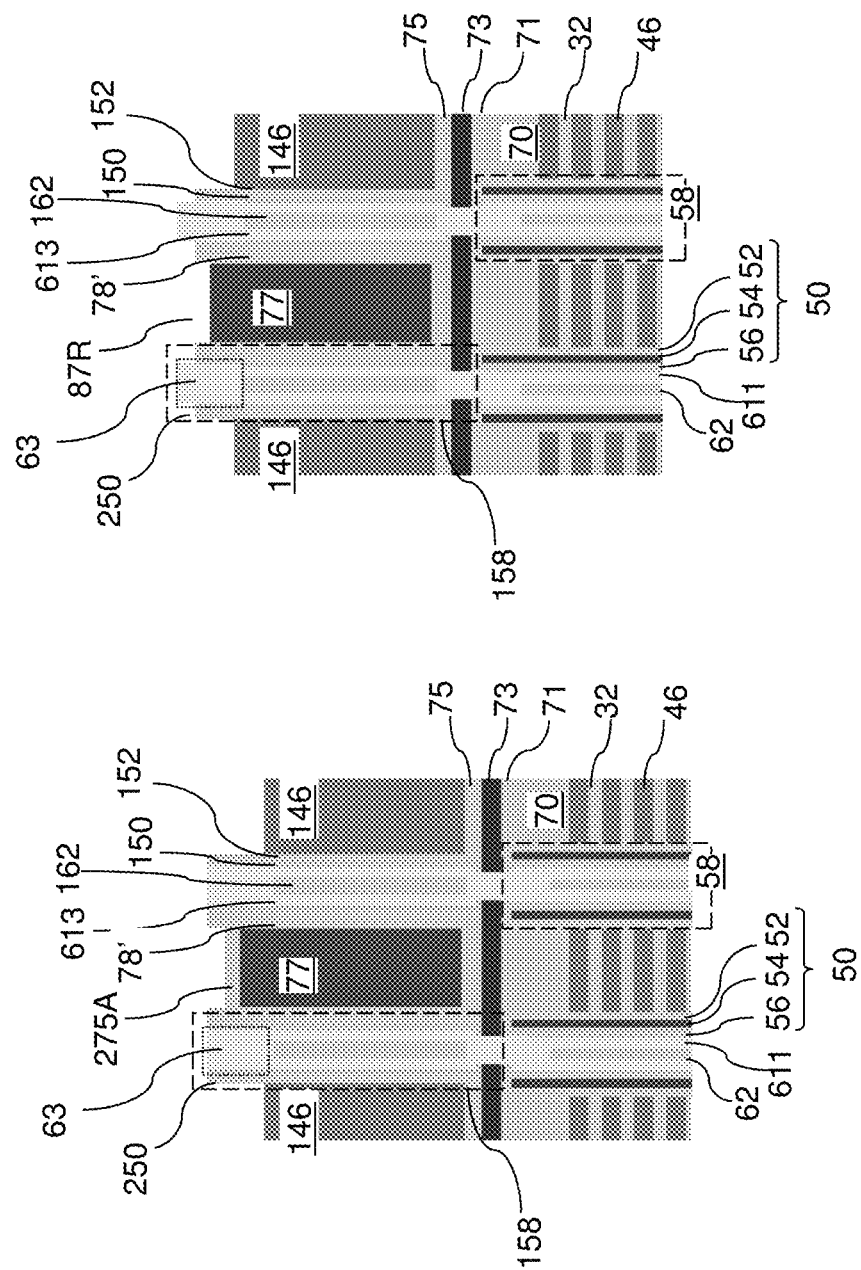

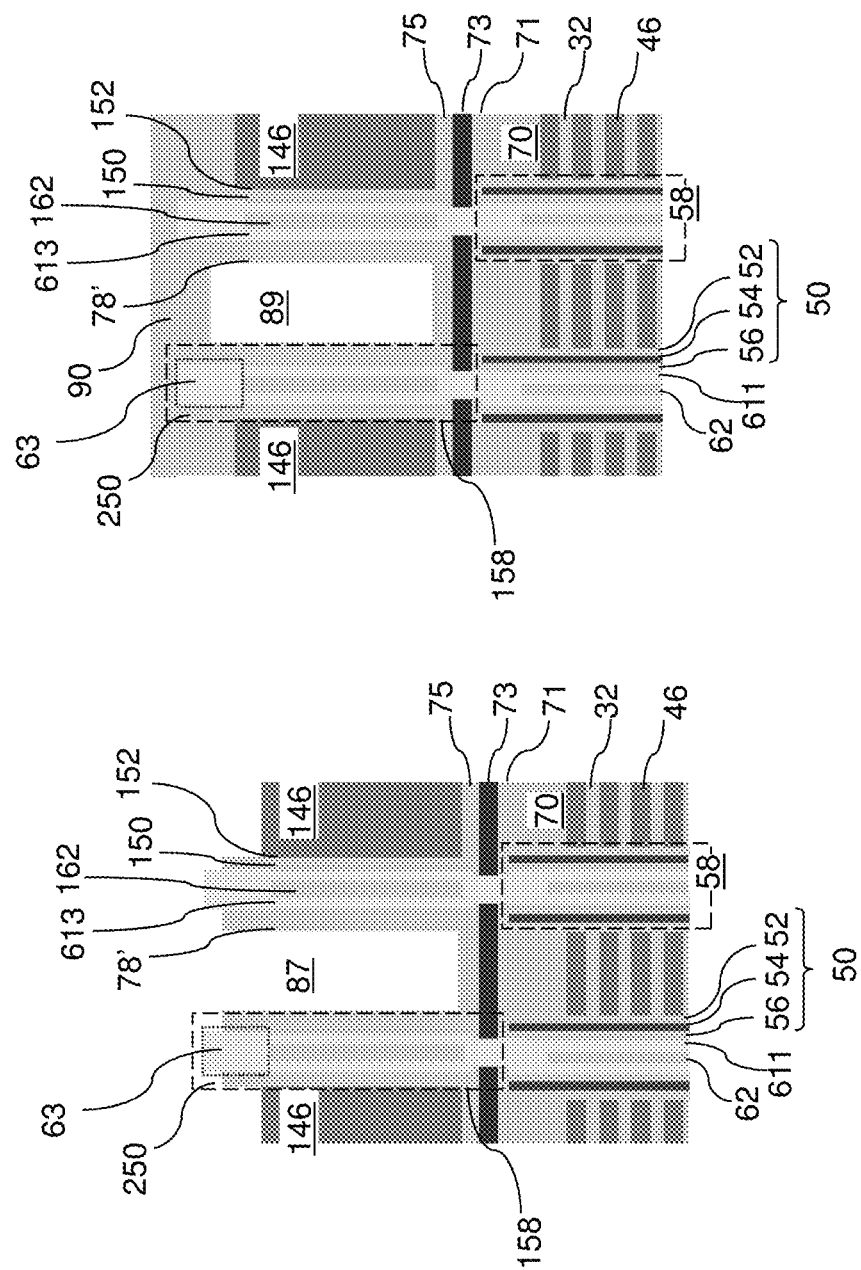

THREE-DIMENSIONAL MEMORY DEVICE CONTAINING DRAIN-SELECT-LEVEL AIR GAP AND METHODS OF MAKING THE SAME

FIELD

The present disclosure relates generally to the field of semiconductor devices, and particular to a three-dimensional memory device containing drain-select-level air gap and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell," IEDM Proc. (2001) 33-36.

SUMMARY

According to an aspect of the present disclosure, a three-dimensional memory device includes an alternating stack of insulating layers and word lines located over a substrate, memory stack structures extending through the alternating stack and containing a respective vertical semiconductor channel and a respective memory film, drain select gate electrodes located over the alternating stack, extending along a first horizontal direction, and laterally spaced apart along a second horizontal direction, and a dielectric cap layer located between adjacent drain select gate electrodes. An air gap is located between adjacent drain select gate electrodes in the dielectric cap layer.

According to another aspect of the present disclosure, a method of forming a three-dimensional memory device is provided, which comprises: forming an alternating stack of insulating layers and spacer material layers over a substrate, wherein the spacer material layers are formed as, or are replaced with, word-line-level electrically conductive layers; forming memory stack structures through the alternating stack, wherein each of the memory stack structures comprises a respective vertical semiconductor channel and a respective memory film; forming template rail structures over the alternating stack; forming drain-select-level pillar structures over the memory stack structures, wherein each of the drain-select-level pillar structures comprises a drain-select-level channel contacting an underlying one of the memory stack structures; forming drain-select-level electrode strips over the alternating stack and between neighboring pairs of the template rail structures; forming laterally-extending trenches by removing the template rail structures; and forming a dielectric cap layer in the laterally-extending trenches and over the drain-select-level electrode strips, wherein the dielectric cap layer comprises a planar portion overlying the drain-select-level electrode strips and downward-protruding rail portions filling the laterally-extending trenches and located between neighboring pairs of the drain-select-level electrode strips, wherein each of the downward-protruding rail portions comprises a cavity that is free of any solid phase material or any liquid phase material.

BRIEF DESCRIPTION OF THE DRAWINGS

FIG. 1A is a vertical cross-sectional view of an exemplary structure after formation of at least one peripheral device and in-process source-level material layers according to a first embodiment of the present disclosure.

FIG. 3 is a vertical cross-sectional view of the exemplary structure after formation of stepped terraces and a retro-stepped dielectric material portion according to an embodiment of the present disclosure.

FIGS. 5A-5D are vertical cross-sectional views of a memory opening during formation of a memory opening fill structure according to an embodiment of the present disclosure.

FIGS. 26 to 30 are vertical cross-sectional views of steps for forming drain-select-level gate electrodes according to an embodiment of the present disclosure.

FIG. 31A is a vertical cross-sectional view of the exemplary structure after formation of an air gap according to an embodiment of the present disclosure.

DETAILED DESCRIPTION

Figure 1B:
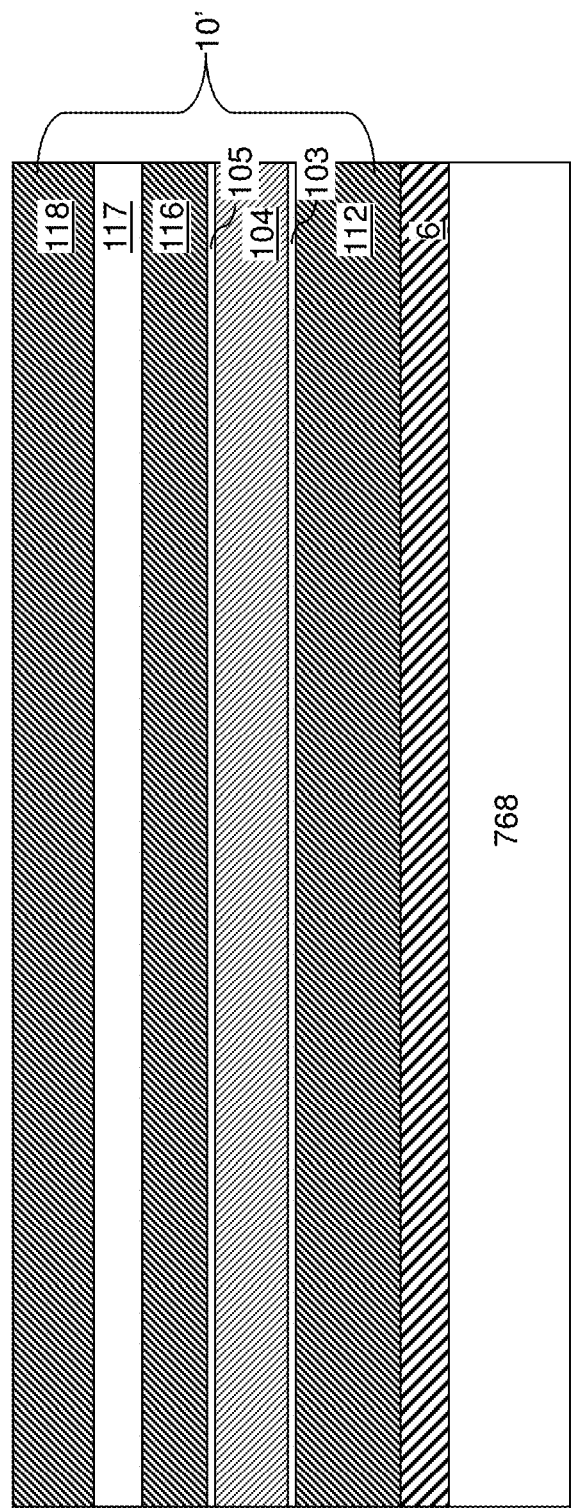
FIG. 1B is a magnified view of an in-process source level material layers of FIG. 1A.

Drain select transistors are used to selectively activate a memory string of without activating neighboring memory strings. Drain select transistors are located in drain select levels and include drain level select gate electrodes. Drain-select-level isolation structures extending along a lengthwise direction are used to provide electrical isolation between adjacent drain select transistors. As the size of the drain select transistors shrinks, the width of the drain-select-level isolation structures also decreases. As a result, the drain-select-level isolation structures become prone to dielectric breakdown and capacitive coupling increases between neighboring pairs of drain level select gate electrodes of the drain select transistors. Embodiments of the present disclosure is directed to a three-dimensional memory device containing drain-select-level air gaps (also referred to herein as "cavity isolation") and methods of manufacturing the same to decrease the above described dielectric breakdown and capacitive coupling. The embodiments of the present disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first", "second", and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIGS. 1A and 1B, an exemplary structure according to an embodiment of the present disclosure is illustrated, which can be employed, for example, to fabricate a device structure containing vertical NAND memory devices. The exemplary structure includes a substrate 8, such as a silicon wafer or a silicon-on-insulator substrate, for example. The substrate 8 can include a substrate semiconductor layer 9 in an upper portion thereof. The substrate semiconductor layer 9 may be an upper portion of the silicon wafer 8, a doped well in the upper portion of the silicon wafer 8, or a semiconductor (e.g., silicon) layer located over a top surface of the substrate. The substrate 8 can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline silicon surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device. A dielectric material such as silicon oxide can be deposited over the at least one semiconductor device, and can be subsequently planarized to form a planarization dielectric layer 770. The region including the at least one semiconductor device 700 is herein referred to as a peripheral device region 200.

A dielectric material layer 768 can be formed over the substrate semiconductor layer 9. The dielectric material layer 768 may include a single dielectric material layer or a plurality of dielectric material layers. The dielectric material layer 768 may include any one or more of doped silicate glass, undoped silicate glass, and organosilicate glass. In one embodiment, the at least one dielectric material layer 768 can comprise, or consist essentially of, dielectric material layers having dielectric constant that does not exceed the dielectric constant of undoped silicate glass (i.e., silicon oxide) of 3.9.

An optional layer of a metallic material and a layer of a semiconductor material can be deposited over, or within patterned recesses of, the dielectric material layer 768, and are lithographically patterned to provide an optional conductive plate layer 6 and in-process source-level material layers 10'. As used herein, an "in-process" element refers to an element that is modified during a subsequent processing step. The optional conductive plate layer 6, if present, provides a high conductivity conduction path for electrical current that flows into, or out of, the in-process source-level material layers 10'. The optional conductive plate layer 6 includes a conductive material such as a metal, metal silicide, or a heavily doped semiconductor material. The optional conductive plate layer 6, for example, may include a tungsten or tungsten silicide layer having a thickness in a range from 3 nm to 100 nm, although lesser and greater thicknesses can also be employed. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 can include a metallic compound material such as a conductive metallic silicide or nitride (e.g., TiN) and/or a metal (e.g., W). The thickness of the optional conductive plate layer 6 may be in a range from 5 nm to 100 nm, although lesser and greater thicknesses can also be employed.

The in-process source-level material layers 10' can include various layers that are subsequently modified to form source-level material layers. The source-level material layers, upon formation, include a source contact layer that functions as a common source region for vertical field effect transistors of a three-dimensional memory device. In one embodiment, the in-process source-level material layer 10' can include, from bottom to top, a lower source-level material layer 112, a lower sacrificial liner 103, a source-level sacrificial layer 104, an upper sacrificial liner 105, an upper source-level material layer 116, a source-level insulating layer 117, and an optional source-select-level conductive layer 118.

The lower source-level material layer 112 and the upper source-level material layer 116 can include a doped semiconductor material such as doped polysilicon or doped amorphous silicon. The conductivity type of the lower source-level material layer 112 and the upper source-level material layer 116 can be the opposite of the conductivity of vertical semiconductor channels to be subsequently formed. For example, if the vertical semiconductor channels to be subsequently formed have a doping of a first conductivity type, the lower source-level material layer 112 and the upper source-level material layer 116 have a doping of a second conductivity type that is the opposite of the first conductivity type. The thickness of each of the lower source-level material layer 112 and the upper source-level material layer 116 can be in a range from 10 nm to 300 nm, such as from 20 nm to 150 nm, although lesser and greater thicknesses can also be employed.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon, polysilicon, or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be employed.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be employed.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be employed. The optional source-select-level conductive layer 118 can include a conductive material that can be employed as a source-select-level gate electrode. For example, the optional source-select-level conductive layer 118 can include a heavily doped semiconductor material such as heavily doped polysilicon or doped amorphous silicon that can be subsequently converted into doped polysilicon by an anneal process. The thickness of the optional source-level conductive layer 118 can be in a range from 30 nm to 200 nm, such as from 60 nm to 100 nm, although lesser and greater thicknesses can also be employed.

The in-process source-level material layers 10' can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface 7 of the substrate 8).

The optional conductive plate layer 6 and the in-process source-level material layers 10' may be patterned to provide openings in areas in which through-memory-level contact via structures and through-dielectric contact via structures are to be subsequently formed. Patterned portions of the stack of the conductive plate layer 6 and the in-process source-level material layers 10' are present in each memory array region 100 in which three-dimensional memory stack structures are to be subsequently formed. Thus, regions in which the in-process source-level material layers 10' are present include a memory array region 100 in which memory devices are to be subsequently formed and a contact region 300 in which stepped surfaces and contact via structures contacting various electrically conductive layers are to be subsequently formed.

Figure 2:
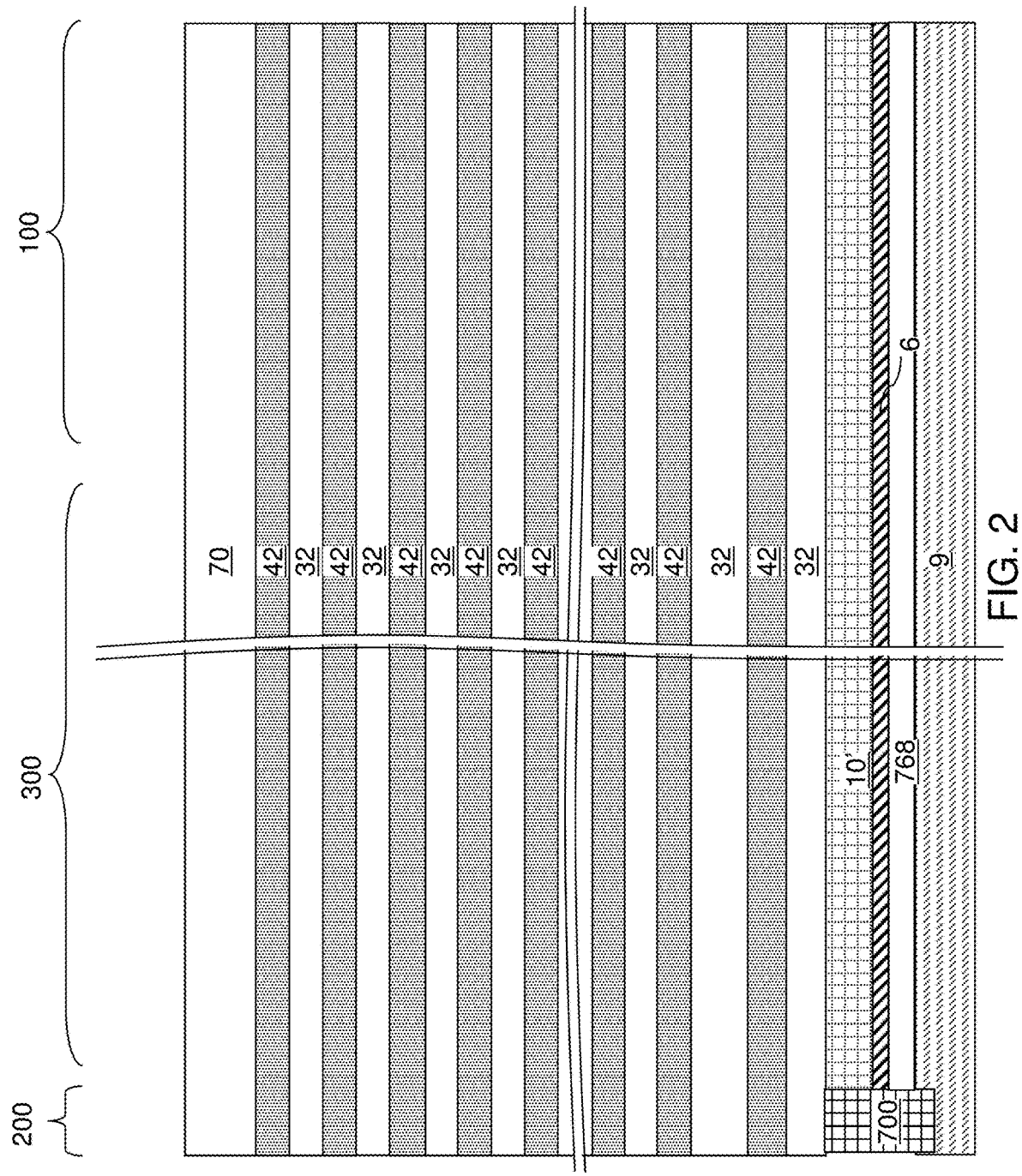
FIG. 2 is a vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate 8. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

An insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Referring to FIG. 3, a stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate 8. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the insulating cap layer 70 and the alternating stack (32, 42) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the insulating cap layer 70 and the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the topmost surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4A:
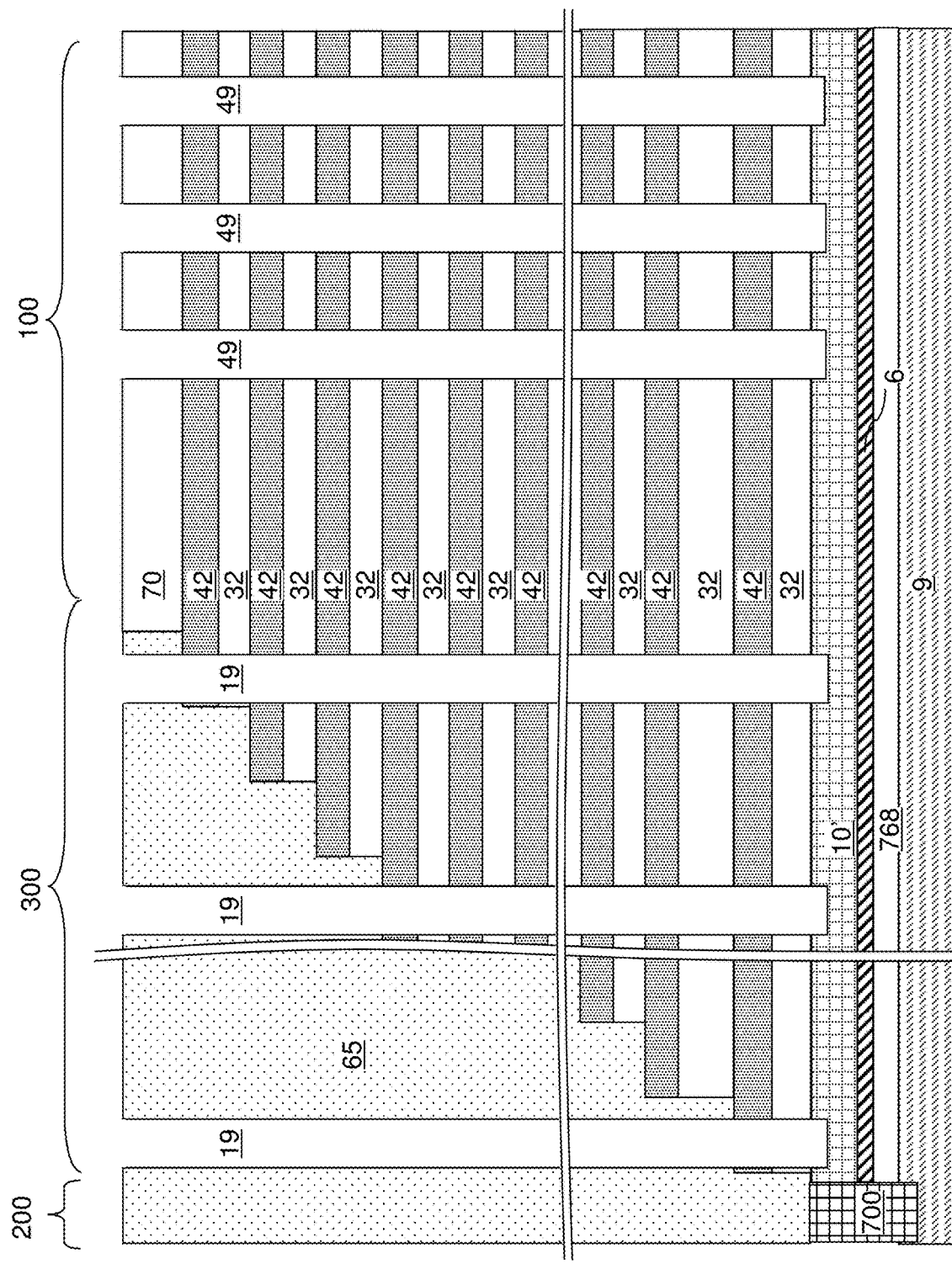
FIG. 4A is a vertical cross-sectional view of the exemplary structure after formation of memory openings according to an embodiment of the present disclosure.
Figure 4B:
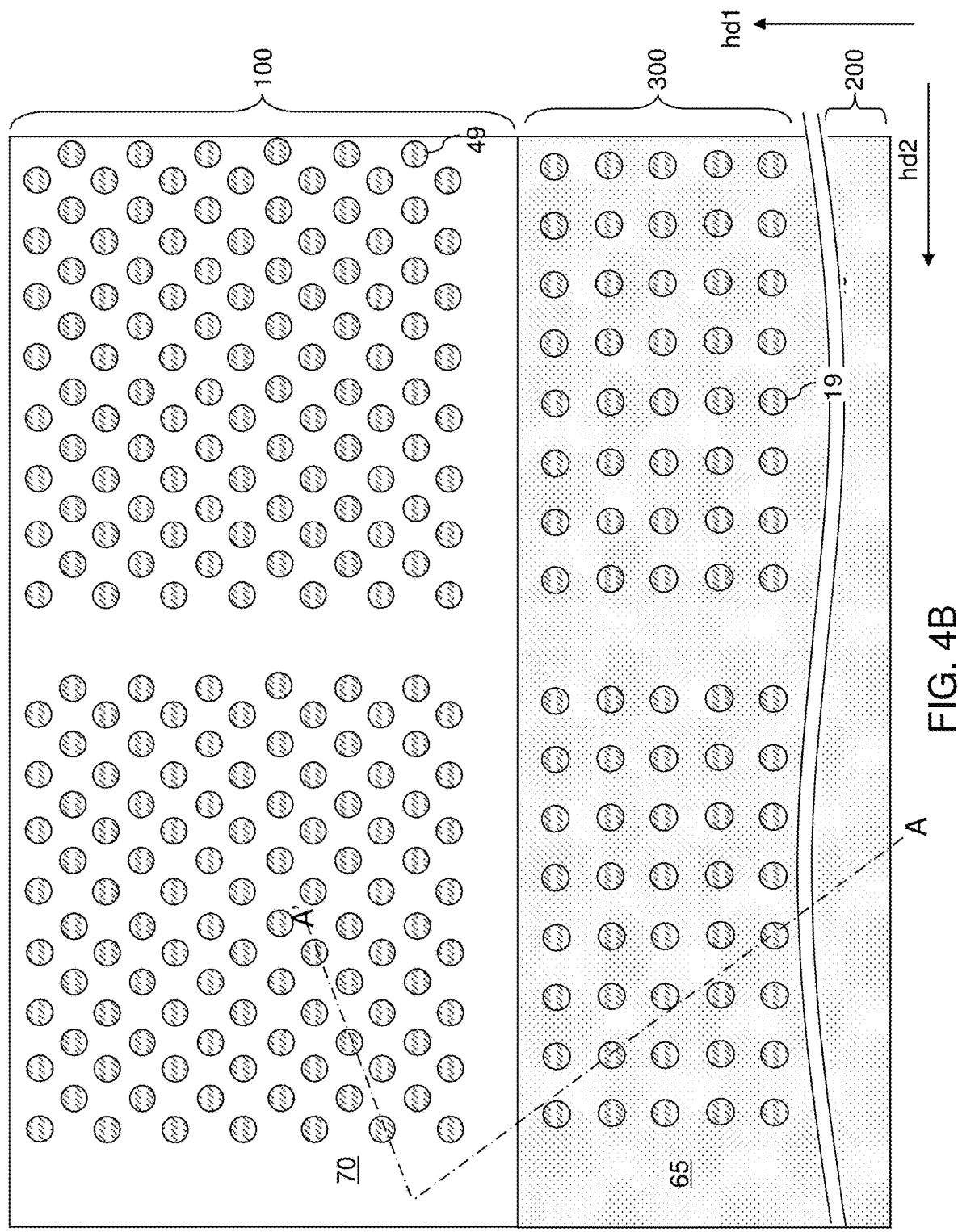
FIG. 4B is a top-down view of the exemplary structure of FIG. 4A. The hinged vertical plane A-A' is the plane of the vertical cross-sectional view of FIG. 4A.
Figure 6A:
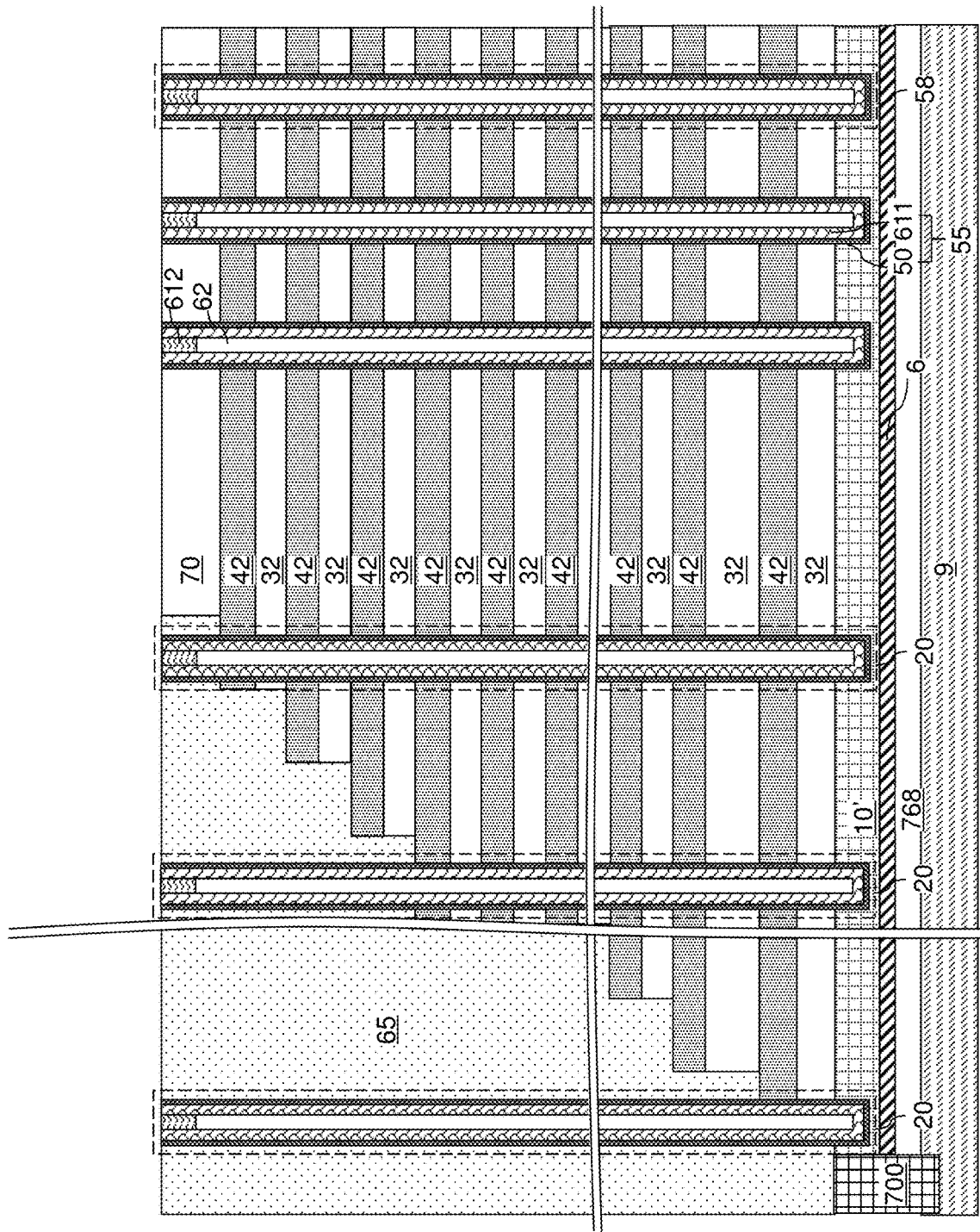
FIG. 6A is a vertical cross-sectional view of the exemplary structure after formation of memory stack structures according to an embodiment of the present disclosure.
Figure 6B:
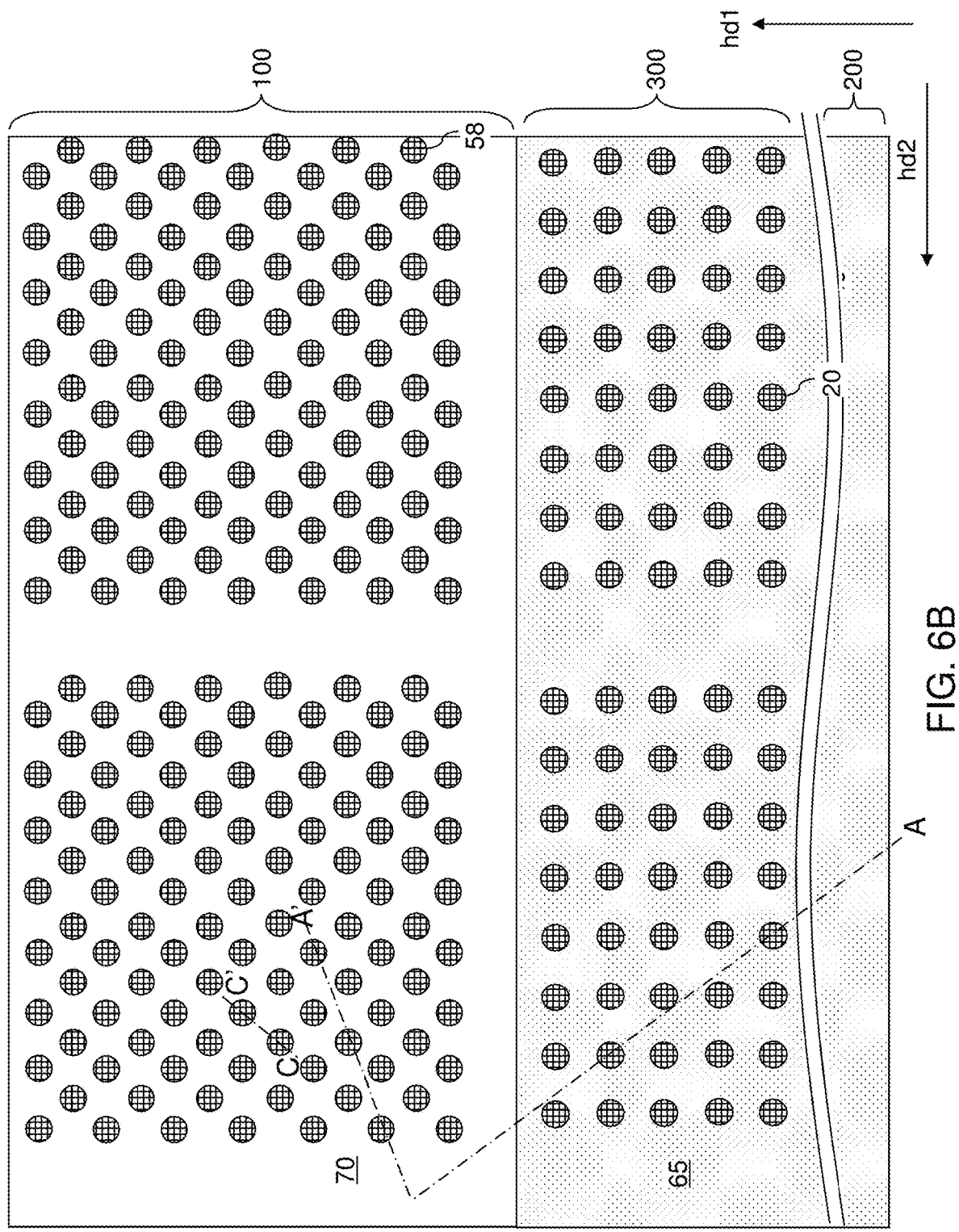
FIG. 6B is a top-down view of the exemplary structure of FIG. 6A. The hinged vertical plane A-A' is the plane of the vertical cross-sectional view of FIG. 6A.
Figure 6C:
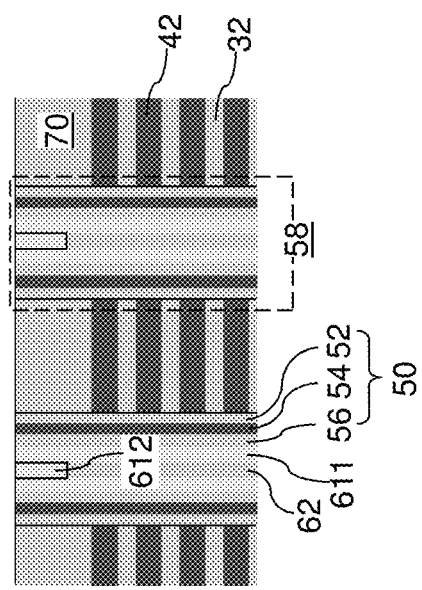
FIG. 6C is a vertical cross-sectional view of a region of the exemplary structure along the vertical plane C-C' in FIG. 6B.

Referring to FIGS. 4A, 4B, and 5A, a lithographic material stack (not shown) including at least a photoresist layer can be formed over the insulating cap layer 70, and can be lithographically patterned to form openings therein. The openings include a first set of openings formed over the memory array region 100 and a second set of openings formed over the contact region 300. The pattern in the lithographic material stack can be transferred through the insulating cap layer 70, the alternating stack (32, 42), and the retro-stepped dielectric material portion 65 by at least one anisotropic etch that employs the patterned lithographic material stack as an etch mask.

Portions of the insulating cap layer 70 and the alternating stack (32, 42) underlying the openings in the patterned lithographic material stack within the memory array region 100 are etched to form memory openings 49. Portions of the insulating cap layer 70, the alternating stack (32, 42), and the retro-stepped dielectric material portion 65 underlying the openings in the patterned lithographic material stack within the contact region 300 are etched to form support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surfaces of the insulating cap layer 70 to the lower source-level material layer 112 in the in-process source-level material layers 10. In one embodiment, an overetch into the lower source-level material layer 112 may be optionally performed after the top surface of the lower source-level material layer 112 is physically exposed at a bottom of each memory opening 49 and each support opening 19. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the lower source-level material layer 112.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300.

The memory openings 49 can be arranged in groups such that each group includes a plurality of rows of memory openings 49. Within each group of memory openings 49, the memory openings 49 can be arranged as rows that extend along the first horizontal direction hd1. The multiple rows can be spaced apart along the second horizontal direction hd2 that is perpendicular to the first horizontal direction hd1 with a uniform inter-row pitch for an entirety of the group of memory openings 49. In this case, the rows of memory openings 49 are "on-pitch," i.e., have a uniform pitch, along the second horizontal direction. In one embodiment, the memory openings can be arranged in clusters, i.e., groups, that include multiple rows of memory openings 49. In one embodiment, the memory openings 49 in a cluster can be arranged as a two-dimensional hexagonal array having a two-dimensional periodicity.

Referring to FIG. 5B, a continuous memory film 50L and a semiconductor channel material layer 611L can be sequentially deposited in the memory opening 49 and in the support openings 19. Each continuous memory film 50L can include a stack of layers including a continuous blocking dielectric layer 52L, a continuous charge storage layer 54L, and a continuous tunneling dielectric layer 56L. The continuous memory film 50L continuous extends into each memory opening 49 and into each support opening 19.

The continuous blocking dielectric layer 52L can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the continuous blocking dielectric layer 52L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the continuous blocking dielectric layer 52L includes aluminum oxide. In one embodiment, the continuous blocking dielectric layer 52L can include multiple dielectric metal oxide layers having different material compositions.

Alternatively or additionally, the continuous blocking dielectric layer 52L can include a dielectric semiconductor compound such as silicon oxide, silicon oxynitride, silicon nitride, or a combination thereof. In one embodiment, the continuous blocking dielectric layer 52L can include silicon oxide. In this case, the dielectric semiconductor compound of the continuous blocking dielectric layer 52L can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the continuous blocking dielectric layer 52L can be omitted, and a backside blocking dielectric layer can be formed after formation of backside recesses on surfaces of memory films to be subsequently formed.

Subsequently, the continuous charge storage layer 54L can be formed. In one embodiment, the continuous charge storage layer 54L can be a continuous layer or patterned discrete portions of a charge trapping material including a dielectric charge trapping material, which can be, for example, silicon nitride. Alternatively, the continuous charge storage layer 54L can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the continuous charge storage layer 54L includes a silicon nitride layer. In one embodiment, the sacrificial material layers 42 and the insulating layers 32 can have vertically coincident sidewalls, and the continuous charge storage layer 54L can be formed as a single continuous layer. As used herein, a first surface and a second surface are "vertically coincident" if the second surface overlies or underlies the first surface and if there exists a vertical plane including the first surface and the second surface.

In another embodiment, the sacrificial material layers 42 can be laterally recessed with respect to the sidewalls of the insulating layers 32, and a combination of a deposition process and an anisotropic etch process can be employed to form the continuous charge storage layer 54L as a plurality of memory material portions that are vertically spaced apart. While the present disclosure is described employing an embodiment in which the continuous charge storage layer 54L is a single continuous layer, embodiments are expressly contemplated herein in which the continuous charge storage layer 54L is replaced with a plurality of memory material portions (which can be charge trapping material portions or electrically isolated conductive material portions) that are vertically spaced apart.

The continuous charge storage layer 54L can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the continuous charge storage layer 54L may comprise an insulating charge trapping material, such as one or more silicon nitride segments. Alternatively, the continuous charge storage layer 54L may comprise conductive nanoparticles such as metal nanoparticles, which can be, for example, ruthenium nanoparticles. The continuous charge storage layer 54L can be formed, for example, by chemical vapor deposition (CVD), atomic layer deposition (ALD), physical vapor deposition (PVD), or any suitable deposition technique for storing electrical charges therein. The thickness of the continuous charge storage layer 54L can be in a range from 2 nm to 20 nm, although lesser and greater thicknesses can also be employed.

The continuous tunneling dielectric layer 56L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The continuous tunneling dielectric layer 56L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the continuous tunneling dielectric layer 56L can include a stack of a first silicon oxide layer, a silicon oxynitride layer, and a second silicon oxide layer, which is commonly known as an ONO stack. In one embodiment, the continuous tunneling dielectric layer 56L can include a silicon oxide layer that is substantially free of carbon or a silicon oxynitride layer that is substantially free of carbon. The thickness of the continuous tunneling dielectric layer 56L can be in a range from 2 nm to 20 nm, although lesser and greater thicknesses can also be employed.

The semiconductor channel material layer 611L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 611L includes amorphous silicon or polysilicon. The semiconductor channel material layer 611L can be formed by a conformal deposition method such as low pressure chemical vapor deposition (LPCVD). The thickness of the semiconductor channel material layer 611L can be in a range from 2 nm to 20 nm, although lesser and greater thicknesses can also be employed. The semiconductor channel material layer 611L can have a doping of a first conductivity type at a dopant concentration in a range from $1.0 \times 10^{14}/cm^3$ to $3.0 \times 10^{17}/cm^3$. A memory cavity 49' is formed in the volume of each memory opening 49 that is not filled with the deposited material layers (50L, 611L).

Referring to FIG. 5C, a dielectric material such as undoped silicate glass, a doped silicate glass, or organosilicate glass can be deposited in the memory cavities 49' and unfilled volumes of the support openings 19 by a conformal or non-conformal deposition method. The dielectric material can be vertically recessed by a recess etch process such that remaining portions of the dielectric material have top surfaces between the horizontal plane including the top surface of the insulating cap layer 70 and the horizontal plane including the bottom surface of the insulating cap layer 70. Each remaining portion of the dielectric material constitutes a dielectric core 62. A recess cavity is present above each dielectric core 62.

Referring to FIGS. 5D, 6A, 6B, and 6C, a sacrificial material portion 612 can be formed in the recess cavities by deposition of a sacrificial material. In one embodiment, the sacrificial material can be a semiconductor material having a doping of the first conductivity type, i.e., the conductivity type of the semiconductor channel material layer 611L. Excess portions of the sacrificial material and horizontal portions of the continuous memory film 50L can be removed from above the horizontal plane including the top surface of the insulating cap layer 70. Each remaining portion of the sacrificial material constitutes a sacrificial material portion 612. In one embodiment, the sacrificial material portions 612 can include polysilicon or amorphous silicon having a doping of the first conductivity type. Each remaining portion of the semiconductor channel material layer 611L located in a respective memory opening 49 or in a respective support opening 19 constitutes a vertical semiconductor channel 611. Each remaining portion of the continuous memory film 50L located in a respective memory opening 49 or in a respective support opening 19 constitutes a memory film 50.

Each discrete remaining portion of the continuous blocking dielectric layer 52L constitutes a blocking dielectric layer 52. Each discrete remaining portion of the continuous charge storage layer 54L constitutes a charge storage layer 54. Each discrete remaining portion of the continuous tunneling dielectric layer 56L constitutes a tunneling dielectric layer 56. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each contiguous combination of a vertical semiconductor channel 611 and a memory film 50 in a memory opening 49 constitutes a memory stack structure 55. Each memory stack structure 55 is formed through the alternating stack (32, 42). Each contiguous combination of a memory stack structure 55, a dielectric core 62, and a sacrificial material portion 612 fills a respective memory opening 49, and constitutes a memory opening fill structure 58. Each contiguous combination of a memory film 50, a vertical semiconductor channel 601, a dielectric core 62, and a sacrificial material portion 612 that fills a support opening 19 constitutes a support opening fill structure 20. The memory stack structures 55 can be arranged in clusters. In one embodiment, the memory stack structures 55 in a cluster can be arranged as a two-dimensional hexagonal array having a two-dimensional periodicity.

Figure 7A:
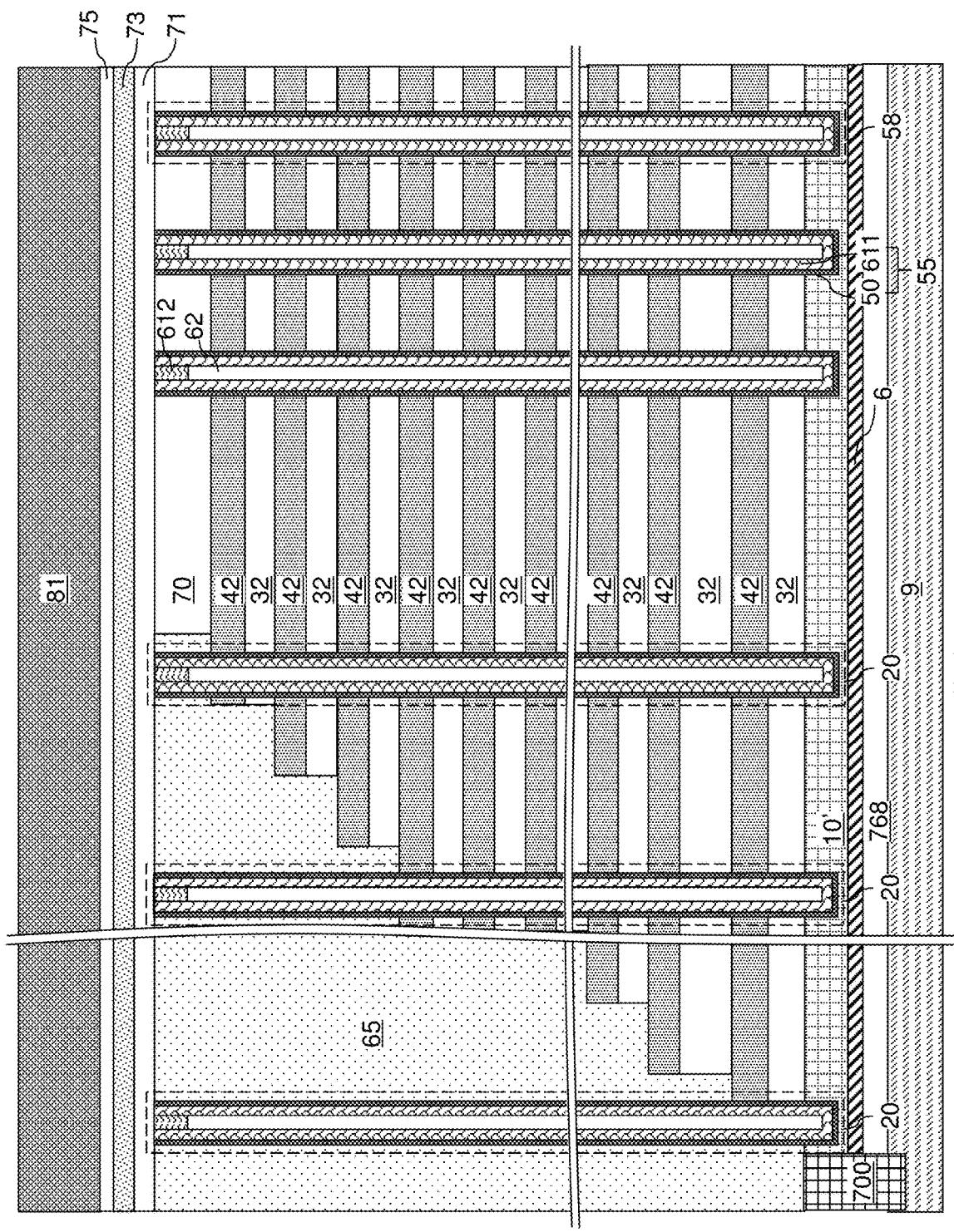
FIG. 7A is a vertical cross-sectional view of the exemplary structure after formation of a dielectric etch stop layer and a sacrificial fill material layer according to an embodiment of the present disclosure.
Figure 7B:
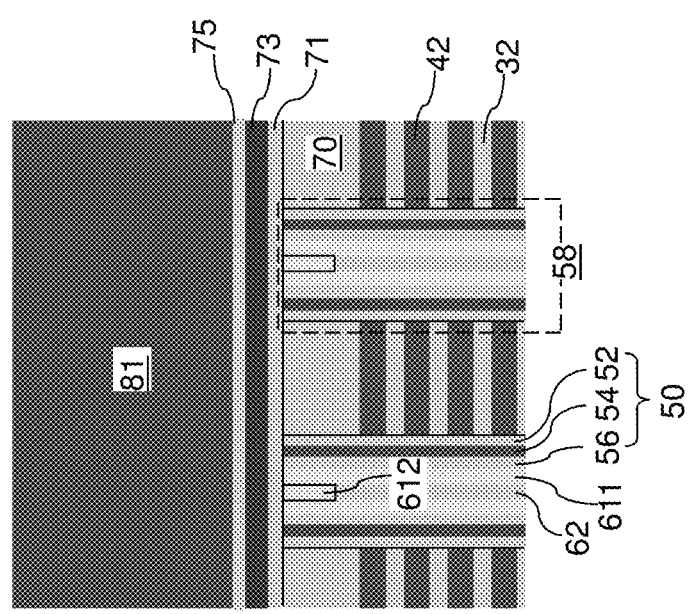
FIG. 7B is a vertical cross-sectional view of a region of the exemplary structure of FIG. 7A.

Referring to FIGS. 7A and 7B, a planar insulating spacer layer 71, a dielectric etch stop layer 73, a dielectric liner 75, and sacrificial fill material layer 81 are sequentially formed on the top surface of the insulating cap layer 70, the memory opening fill structures 58, and the support opening fill structures 20. The planar insulating spacer layer 71 includes a dielectric material such as silicon oxide, and can have a thickness in a range from 20 nm to 200 nm, although lesser and greater thicknesses can also be employed. The dielectric etch stop layer 73 includes a dielectric material that can function as an etch stop material during subsequent patterning of the sacrificial fill material layer 81. In one embodiment, the dielectric etch stop layer 73 can include a dielectric metal oxide such as aluminum oxide. The thickness of the dielectric etch stop layer 73 can be in a range from 2 nm to 50 nm, although lesser and greater thicknesses can also be employed. The dielectric liner 75 includes a dielectric material such as silicon oxide, and can have a thickness in a range from 2 nm to 50 nm, although lesser and greater thicknesses can also be employed. The sacrificial fill material layer 81 includes a material that is different from the material of the dielectric etch stop layer 73 and the dielectric liner 75. For example, the sacrificial fill material layer 81 can include silicon nitride. The thickness of the sacrificial fill material layer 81 can be in a range from 20 nm to 400 nm, such as from 40 nm to 200 nm, although lesser and greater thicknesses can also be employed.

Figure 8:
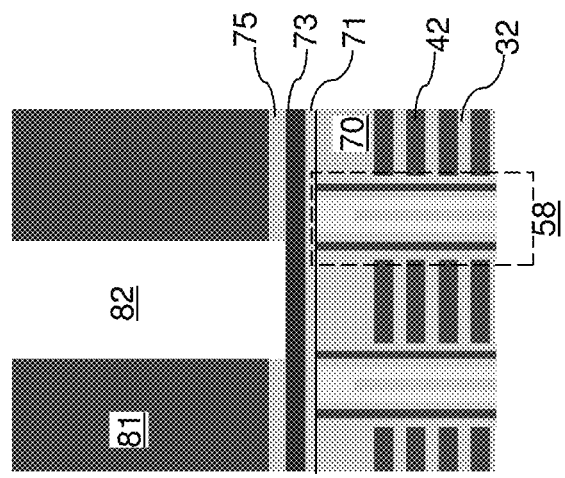
FIG. 8 is a vertical cross-sectional view of a region of the exemplary structure after forming trenches according to an embodiment of the present disclosure.

Referring to FIG. 8, the sacrificial fill material layer 81 is patterned to form rail shaped trenches 82 in layer 81. For example, a photoresist layer (not shown) can be applied over layer 81 and is lithographically patterned to form line patterns therein. The line patterns the photoresist layer are transferred through layer 81 and dielectric liner 75 by an anisotropic etch process, to form the rail shaped trenches 82. The dielectric etch stop layer 73 functions as an etch stop structure during formation of the trenches 82. The trenches 82 laterally extend along the first horizontal direction hd1 and have a uniform width along the second horizontal direction hd2 of 10 to 30 nm, such as 15 to 20 nm. The trenches 82 are laterally spaced apart along the second horizontal direction hd2.

Figure 9:
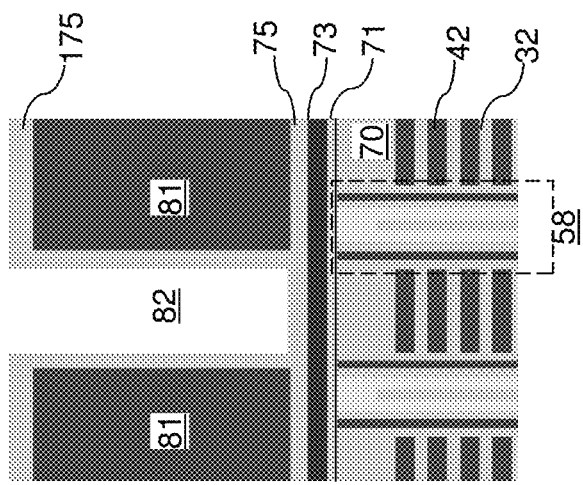
FIG. 9 is a vertical cross-sectional view of the exemplary structure after formation of a sacrificial liner according to an embodiment of the present disclosure.

Referring to FIG. 9 sacrificial liner 175 can be deposited in the rail shaped trenches 82 on the top surfaces and sidewalls of layer 81 and on the top surface of portions of the dielectric etch stop layer 73 which are physically exposed in the trenches 82. The sacrificial liner 175 includes a material that is different from the materials of the dielectric etch stop layer 73. For example, the sacrificial liner 175 can include silicon oxide. The thickness of the sacrificial liner 175 can be in a range from 1 nm to 20 nm, such as from 2 nm to 10 nm, although lesser and greater thicknesses can also be employed.

Figure 10A:
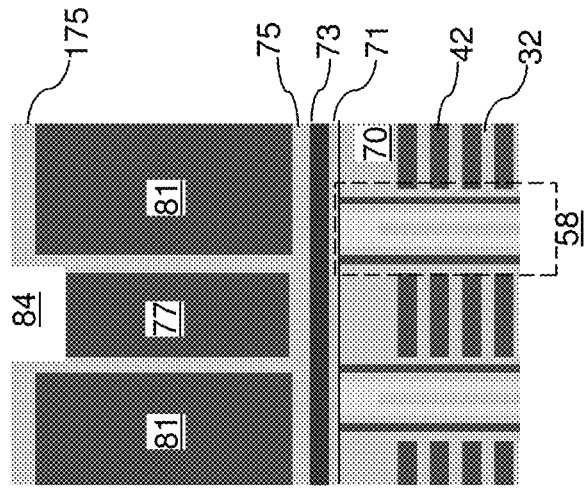
FIG. 10A is a vertical cross-sectional view of the exemplary structure after formation of template rail structures according to an embodiment of the present disclosure.
Figure 10B:
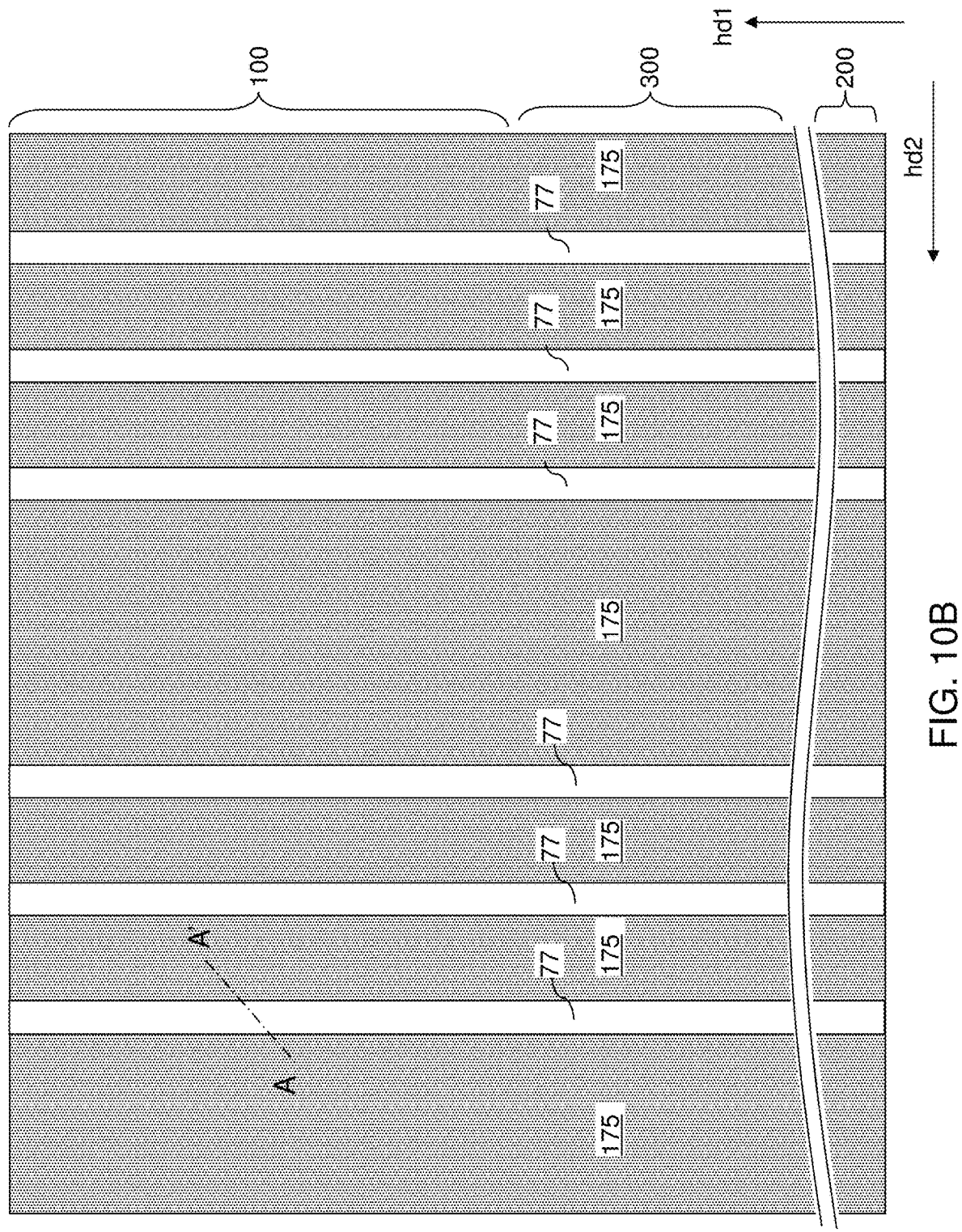
FIG. 10B is a top-down view of the exemplary structure of FIG. 10A. The vertical plane A-A' is the plane of the vertical cross-sectional view of FIG. 10A.

Referring to FIGS. 10A and 10B, template rail structures 77 are formed on the sacrificial liner 175 in the rail shaped trenches 82 located inside sacrificial fill material layer 81. The template rail structures 77 can be formed in multiple discrete portions that are laterally spaced among one another by the sacrificial fill material layer 81. The template rail structures 77 can be formed, for example, by depositing a sacrificial material in the trenches 82 and by planarizing the sacrificial material employing the top surfaces of the sacrificial liner 175 as a stopping structure. The template rail structures 77 are then recessed below the top surfaces of the sacrificial liner 175 and layer 81 using a selective etch to form rail shaped recesses 84. For example, the template rail structures 77 can include silicon nitride. In this case, the selective etch can be a hot phosphoric acid etch which selectively etches the template rail structures 77 compared to the sacrificial liner 175. The template rail structures can be about 100 to 200 nm high and about 15 to 40 nm wide, such as between 20 and 30 nm wide.

Figure 11:
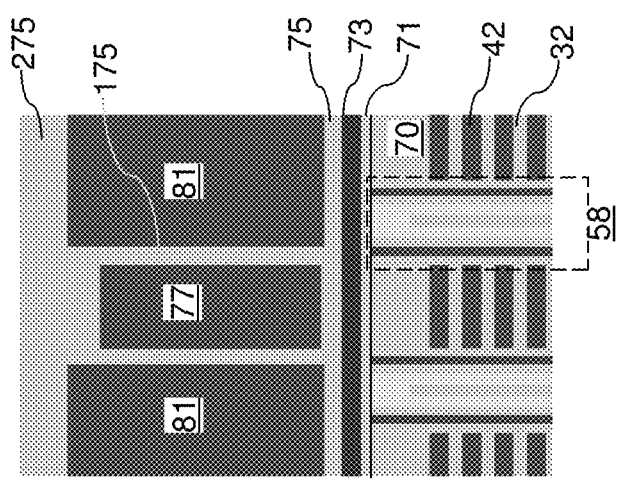
FIG. 11 is a vertical cross-sectional view of the exemplary structure after formation of dielectric cap according to an embodiment of the present disclosure.

Referring to FIG. 11, a dielectric cap 275 is formed in the rail shaped recesses 84 over the template rail structures 77 and over the sacrificial fill material layer 81. The dielectric cap 275 may comprise a dielectric material that is different from the material of the template rail structures 77 and the sacrificial fill material layer 81. For example, if the template rail structures 77 and the sacrificial fill material layer 81 comprise silicon nitride, then the dielectric cap 275 can comprise silicon oxide. The dielectric cap 275 can be planarized by reactive ion etching or CMP. Due to the presence of the recess 84, first portions 275A of the dielectric cap 275 located over the template rail structures 77 are thicker than the second portions 275B of the dielectric cap 275 located over the sacrificial fill material layer 81. For example, the first portion 275A may be 50% to 300% thicker than the second portion 275B. The first portion 275A may be 20 to 50 nm thick, while the second portion 275B may be 5 to 20 nm thick.

Figure 12A:
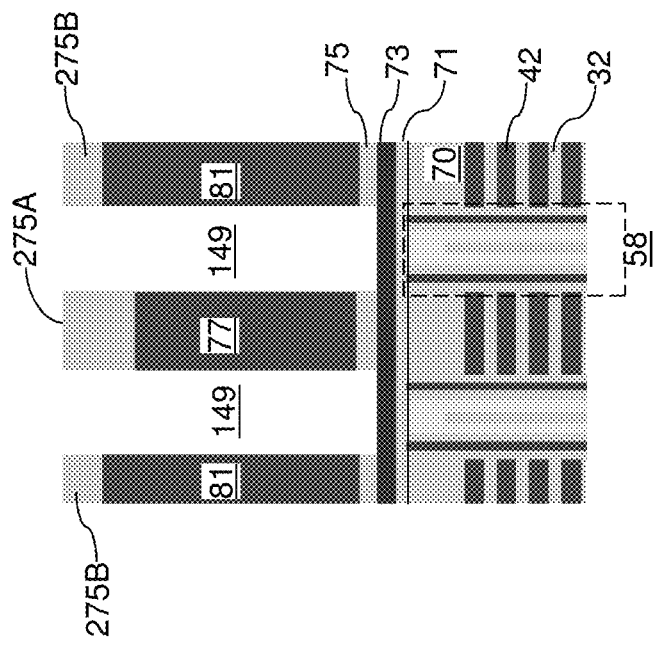
FIG. 12A is a vertical cross-sectional view of the exemplary structure after formation of drain-select-level openings according to an embodiment of the present disclosure.
Figure 12B:
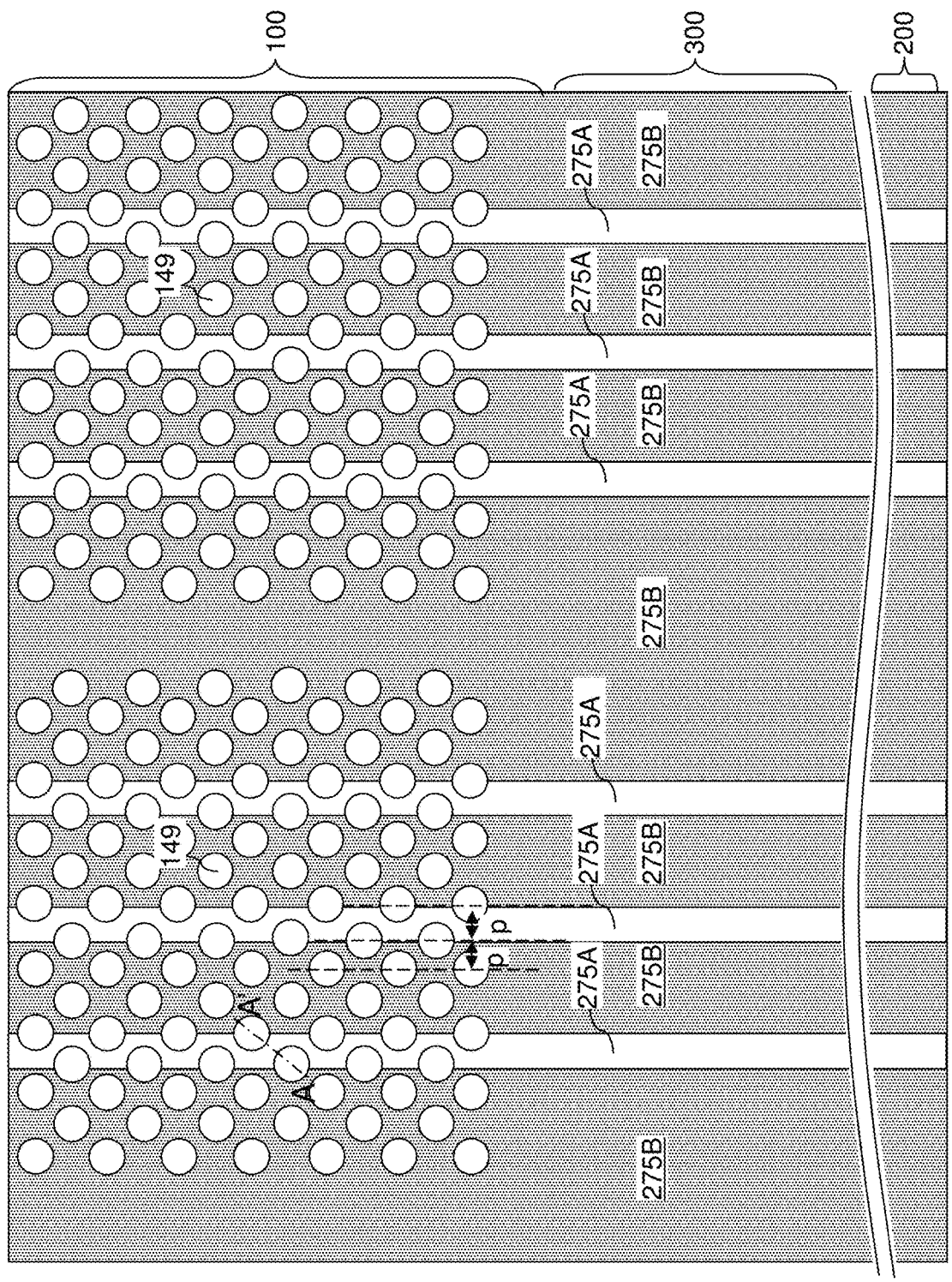
FIG. 12B is a top-down view of the exemplary structure of FIG. 12A. The vertical plane A-A' is the plane of the vertical cross-sectional view of FIG. 12A.

Referring to FIGS. 12A and 12B, drain-select-level openings 149 are formed through the combination of the template rail structures 77, the sacrificial liner 175, the dielectric cap 275 and the sacrificial fill material layer 81. The drain-select-level openings 149 can have the same pattern as the memory openings 49, and thus, can have the same pattern as the memory opening fill structures 58. In one embodiment, the drain-select-level openings 149 can have cylindrical shapes, in which case the drain-select-level opening 149 can be drain-select-level cylindrical openings.

The drain-select-level openings 149 can include a first subset of the drain-select-level openings 149 that extends though vertical portions of the sacrificial liner 175 and through the first portions 275A of the dielectric cap 275, and a second subset of the drain-select-level openings 149 that does not extend through vertical portions of the sacrificial liner 175 and the first portions 275A of the dielectric cap 275. The first subset of the drain-select-level openings 149 extends through a respective one of the template rail structures 77 and a portion of the sacrificial fill material layer 81. The second subset of the drain-select-level openings 149 is laterally spaced from the template rail structures 77, extends through the second portions 275B of the dielectric cap 275 and is formed entirely within the areas of the sacrificial fill material layer 81.

In one embodiment, each sidewall of the template rail structures 77 that extends along the first horizontal direction hd1 can be perforated by a respective row of drain-select-level openings 149. Each sidewall of the template rail structures 77 that extends along the first horizontal direction hd1 can include a laterally alternating sequence of planar vertical sidewall segments and concave vertical sidewall segments. As used herein, a planar vertical sidewall segment refers to a sidewall segment that is located within a vertical two-dimensional plane. As used herein, a concave vertical sidewall segment refers to a sidewall segment that is located within a portion of cylindrical surface having a curvature within a horizontal plane and extending straight along a vertical direction.

In one embodiment, the drain-select-level openings 149 can be arranged in rows that extend along the first horizontal direction hd1, and a row-to-row pitch p can be the same for each neighboring pairs of rows of the drain-select-level openings 149. In one embodiment, the drain-select-level openings 149 are arranged as a two-dimensional hexagonal array, and the memory stack structures 55 are arranged as another two-dimensional hexagonal array having a same two-dimensional periodicity as the two-dimensional hexagonal array of the drain-select-level openings 149.

Figure 13A:
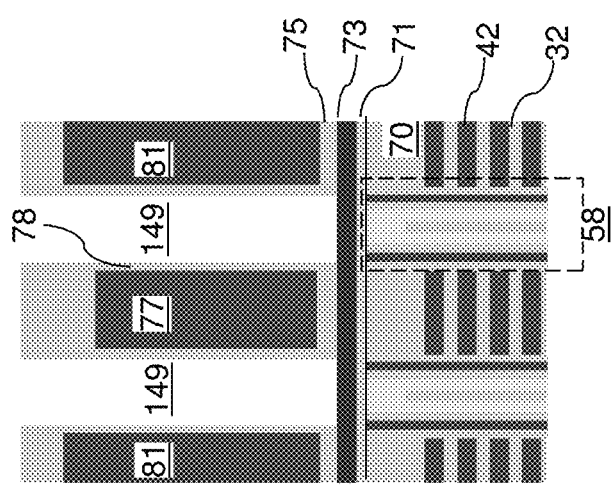
FIG. 13A is a vertical cross-sectional view of the exemplary structure after formation of cylindrical dielectric spacers according to an embodiment of the present disclosure.
Figure 13B:
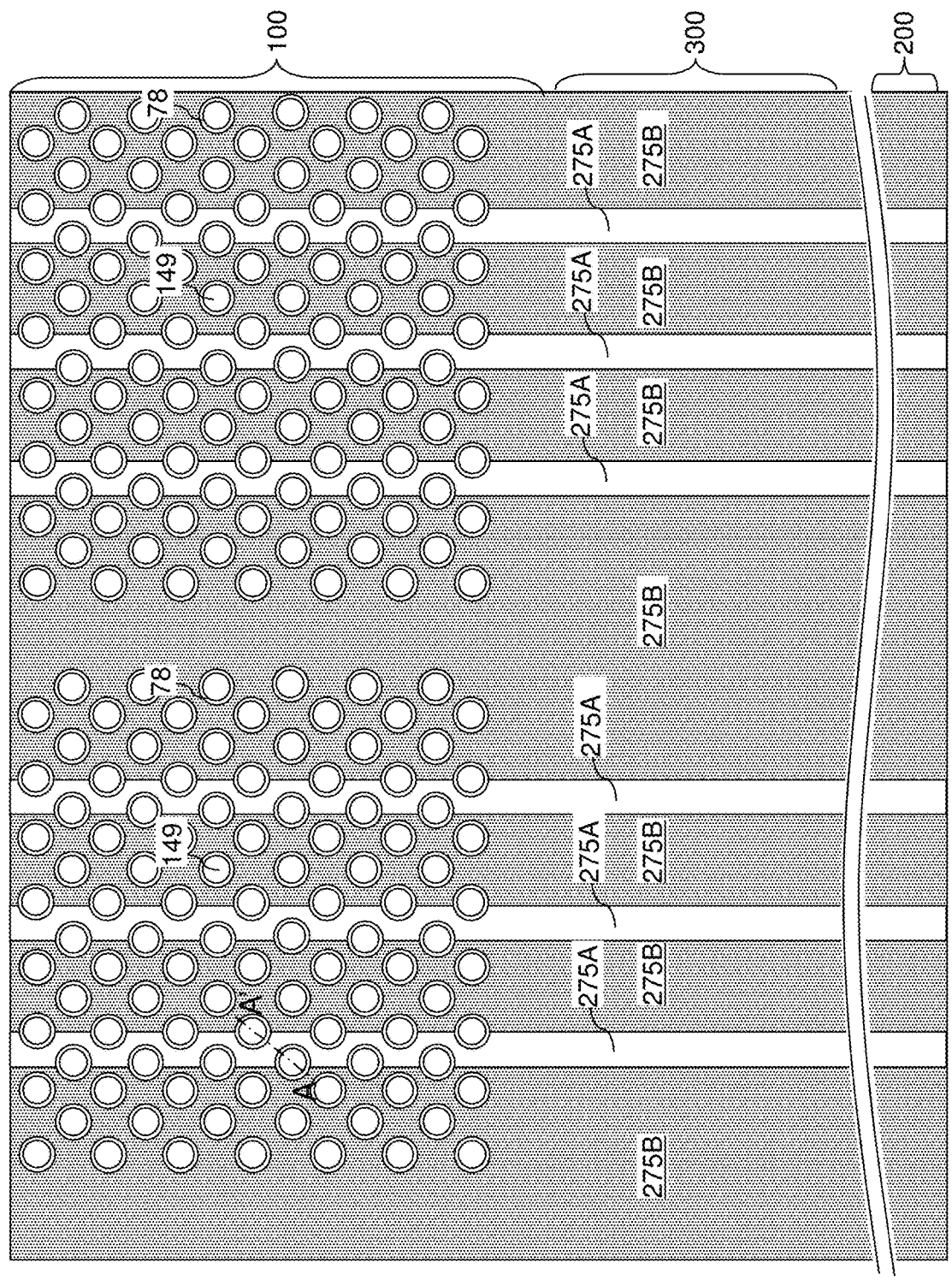
FIG. 13B is a top-down view of the exemplary structure of FIG. 13A. The vertical plane A-A' is the plane of the vertical cross-sectional view of FIG. 13A.

Referring to FIGS. 13A and 13B, a conformal dielectric material layer is deposited and anisotropically etched to form cylindrical dielectric spacers 78 on sidewalls of the drain-select-level openings 149. The cylindrical dielectric spacers 78 are formed within each of the drain-select-level openings 149. The cylindrical dielectric spacers 78 include a dielectric material such as silicon oxide. The cylindrical dielectric spacers 78 can have a uniform lateral thickness, which can be in a range from 1 nm to 20 nm, such as from 2 nm to 10 nm. The cylindrical dielectric spacers 78 are topologically homeomorphic to a torus, i.e., can be continuously stretched into a shape of a torus without forming an additional hole or destroying an existing hole.

Figure 14:
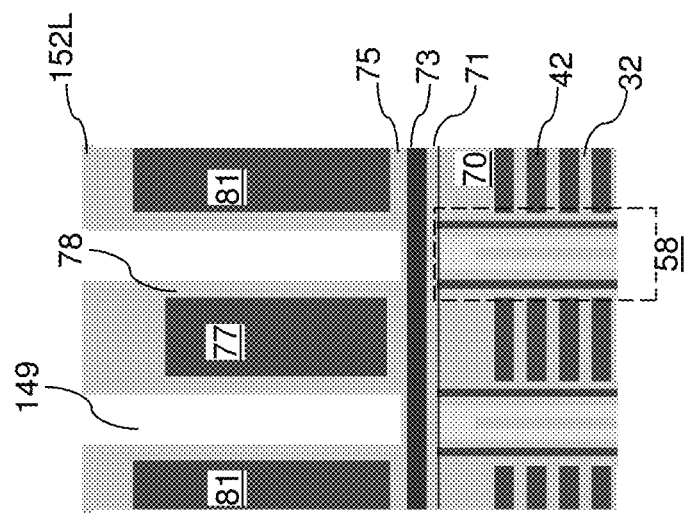
FIG. 14 is a vertical cross-sectional view of the exemplary structure after formation of a gate electrode layer according to an embodiment of the present disclosure.

Referring to FIG. 14, a gate electrode layer 152L can be formed by conformal deposition of a conductive material layer. The gate electrode layer 152L can include an electrically conductive material, including a metallic material, such as TiN, or a heavily doped semiconductor material, such as heavily doped polysilicon or heavily doped amorphous silicon. The thickness of the gate electrode layer 152L can be in a range from 3 nm to 24 nm, such as from 6 nm to 12 nm, although lesser and greater thicknesses can also be employed.

Figure 15:
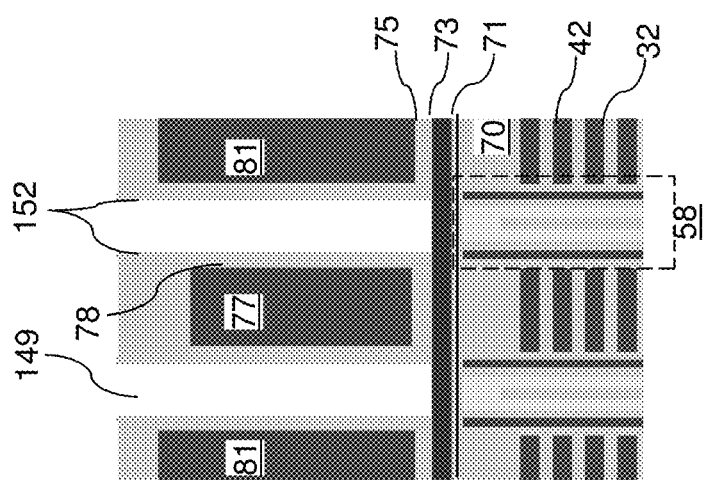
FIG. 15 is a vertical cross-sectional view of the exemplary structure after formation of a cylindrical gate electrode according to an embodiment of the present disclosure.

Referring to FIG. 15, horizontal portions of the gate electrode layer 152L can be removed by an anisotropic etch process. Each remaining cylindrical portion of the gate electrode layer 152L constitutes a cylindrical gate electrode 152. The anisotropic etch proceeds through the dielectric liner 75 to the dielectric etch stop layer 73 which functions as an etch strop structure during the anisotropic etch process. The dielectric cap 275 protects the underlying template rail structures 77 and the sacrificial fill material layer 81.

Figure 16:
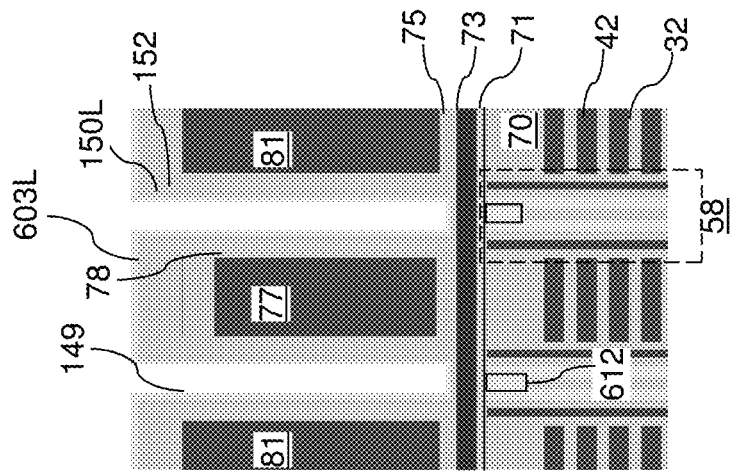
FIG. 16 is a vertical cross-sectional view of the exemplary structure after formation of a gate dielectric layer and a cover material layer according to an embodiment of the present disclosure.

Referring to FIG. 16, a gate dielectric layer 150L and a cover material layer 603L can be sequentially deposited by conformal deposition processes. The gate dielectric layer 150L can include any gate dielectric material. For example, the gate dielectric layer 150L can include silicon oxide and/or a dielectric metal oxide material (such as aluminum oxide and/or hafnium oxide). The thickness of the gate dielectric layer 150L can be in a range from 1.5 nm to 10 nm, such as from 2 nm to 6 nm, although lesser and greater thicknesses can also be employed. The cover material layer 603L can be a sacrificial material that is subsequently removed, or may be a semiconductor material. For example, the cover material layer 603L can include amorphous carbon, amorphous silicon, or polysilicon.

Figure 17:
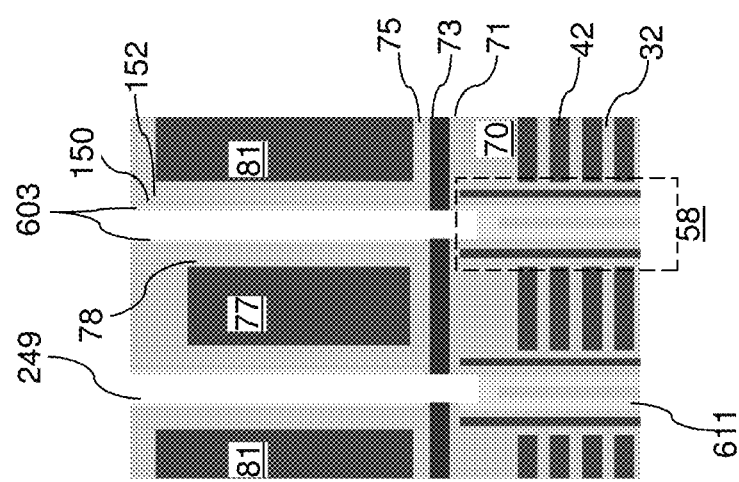
FIG. 17 is a vertical cross-sectional view of the exemplary structure after formation of gate dielectrics and cover material spacers according to an embodiment of the present disclosure.

Referring to FIG. 17, an anisotropic etch process can be performed to sequentially remove horizontal portions of the cover material layer 603L and horizontal portions of the gate dielectric layer 150L. Remaining cylindrical portions of the cover material layer 603L constitute cover material spacers 603 having a respective cylindrical shape. Remaining portions of the gate dielectric layer 150L constitute gate dielectrics 150 having a respective cylindrical shape. The anisotropic etch process can be continued with suitable changes in the etch chemistry to etch through physically exposed portions of the dielectric etch stop layer 73, to etch through physically exposed portions of the planar insulating spacer layer 71, and at least part of the sacrificial material portions 612 (which may be semiconductor material portions). In one embodiment, the etch chemistries of the anisotropic etch process can be selective to the material of the sacrificial fill material layer 81. A drain-select-level cavity 249 vertically extending through the sacrificial fill material layer 81, the template rail structures 77, the dielectric liner 75, the dielectric etch stop layer 73, the planar insulating spacer layer 71, and an upper portion of the insulating cap layer 70 can be formed above each dielectric core 62. Top surfaces and/or sidewall surfaces of the underlying vertical semiconductor channels 611 and/or remaining parts of the sacrificial semiconductor material portions 612 can be physically exposed underneath each drain-select-level cavity 249.

Figure 18:
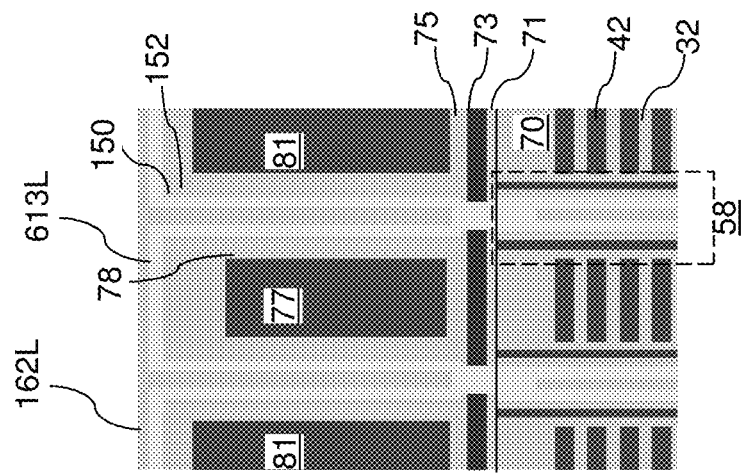
FIG. 18 is a vertical cross-sectional view of the exemplary structure after formation of a drain-select-level semiconductor channel layer and a drain-level dielectric core layer according to an embodiment of the present disclosure.

Referring to FIG. 18, the cover material spacers 603 can be optionally removed selective to the gate dielectrics 150. For example, if the cover material spacers 603 include a sacrificial material such as amorphous carbon, the cover material spacers 603 can be removed selective to the gate dielectrics 150. If the cover material spacers 603 include a semiconductor material such as amorphous silicon or polysilicon, the cover material spacers 603 may, or may not, be removed.

A drain-select-level semiconductor channel layer 613L can be deposited directly on physically exposed surfaces of the vertical semiconductor channels, at peripheral regions of the drain-select-level cavities 249, and over the sacrificial fill material layer 81. In case the cover material spacers 603 include a semiconductor material and remain on inner sidewalls of the gate dielectrics 150 at the time of deposition of the drain-select-level semiconductor channel layer 613L, the remaining portions of the cover material spacers 603 can be incorporated into the drain-select-level semiconductor channel layer 613L. The thickness of the vertical portions of the drain-select-level semiconductor channel layer 613L at the level of the gate dielectrics 150 can be in a range from 2 nm to 30 nm, such as from 4 nm to 20 nm, although lesser and greater thicknesses can also be employed. The drain-select-level semiconductor channel layer 613L may be in-situ doped with dopants of the first conductivity type, or may be doped with dopants of the first conductivity type in a subsequent processing step. A drain-level dielectric core layer 162L such as silicon oxide is deposited in remaining volumes of the drain-select-level cavities and over the drain-select-level semiconductor channel layer 613L by a conformal or non-conformal deposition process.

Figure 19:
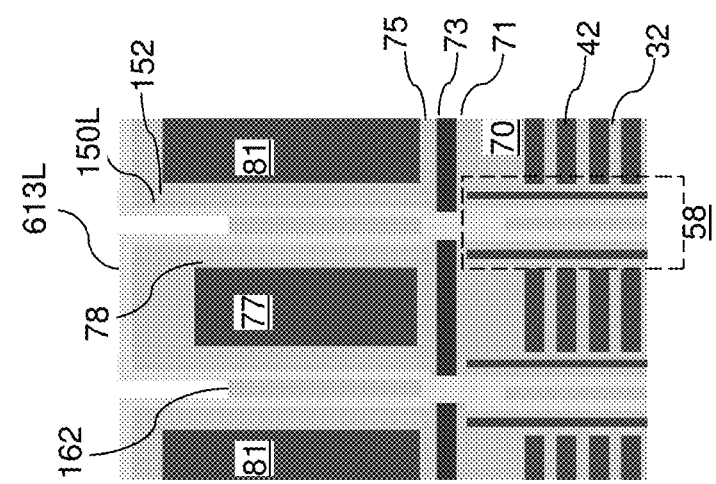
FIG. 19 is a vertical cross-sectional view of the exemplary structure after formation of drain-level dielectric cores according to an embodiment of the present disclosure.

Referring to FIG. 19, the deposited a drain-level dielectric core layer 162L is recessed below the horizontal plane including the top surface of the sacrificial fill material layer 81 by a recess etch process. Each remaining portion of the a drain-level dielectric core layer 162L laterally surrounded by the drain-select-level semiconductor channel layer 613L is herein referred to as a drain-select-level dielectric core 162.

Figure 20:
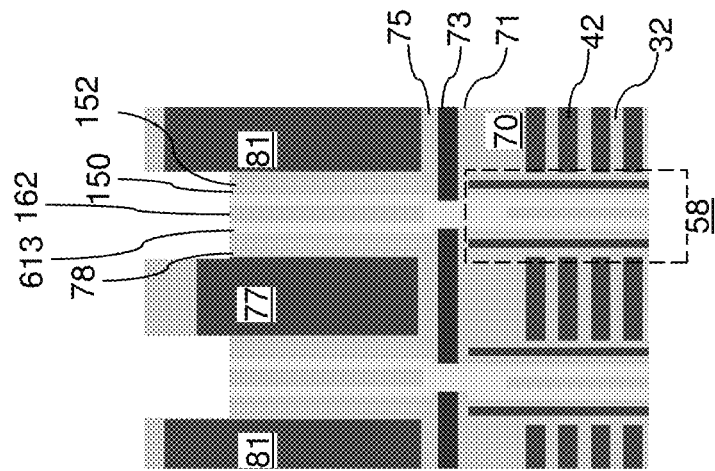
FIG. 20 is a vertical cross-sectional view of the exemplary structure after formation of drain-level-level channels according to an embodiment of the present disclosure.

Referring to FIG. 20, portions of the drain-select-level semiconductor channel layer 613L overlying the top surfaces of the drain-select-level dielectric cores 162 can be removed by an etch back process, which can include an anisotropic etch process or an isotropic etch process. Each remaining portion of the drain-select-level semiconductor channel layer 613L constitutes a drain-select-level channel 613. Optionally, portions of the gate dielectrics 150 and the cylindrical gate electrodes 152 located above the horizontal plane including the top surfaces of the drain-select-level dielectric cores 162 can be removed by isotropic etch processes. Removal of the upper portions of the cylindrical gate electrodes 152 shortens the cylindrical gate electrodes 152, and can increase electrical isolation between the cylindrical gate electrodes 152 and drain regions to be subsequently formed.

Figure 21:
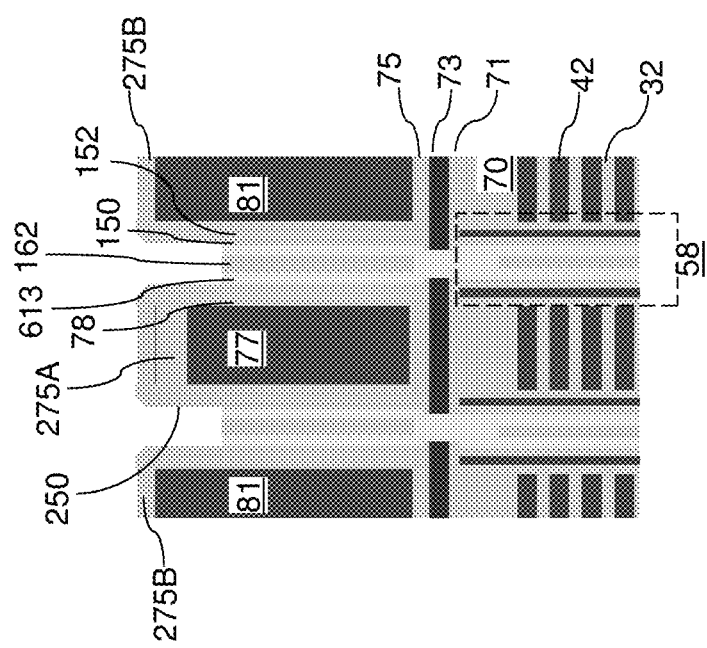
FIG. 21 is a vertical cross-sectional view of the exemplary structure after formation of dielectric drain spacers according to an embodiment of the present disclosure.

Referring to FIG. 21, a dielectric material such as silicon oxide can be conformally deposited over the top surfaces of the cylindrical gate electrodes 152, and can be subsequently anisotropically etched to form dielectric spacers, which are herein referred to as dielectric drain spacers 250. The dielectric drain spacers 250 can contact top surfaces of the cylindrical gate electrodes 152. Top surfaces and/or upper portions of inner sidewalls of the drain-select-level channels 613 are physically exposed after formation of the dielectric drain spacers 250. Optionally, dopants of the first conductivity type can be implanted into the drain-select-level channels 613 to improve transistor characteristics of each vertical transistor including a series connection of a vertical semiconductor channel 611 and a drain-select-level channel 613.

Figure 22A:
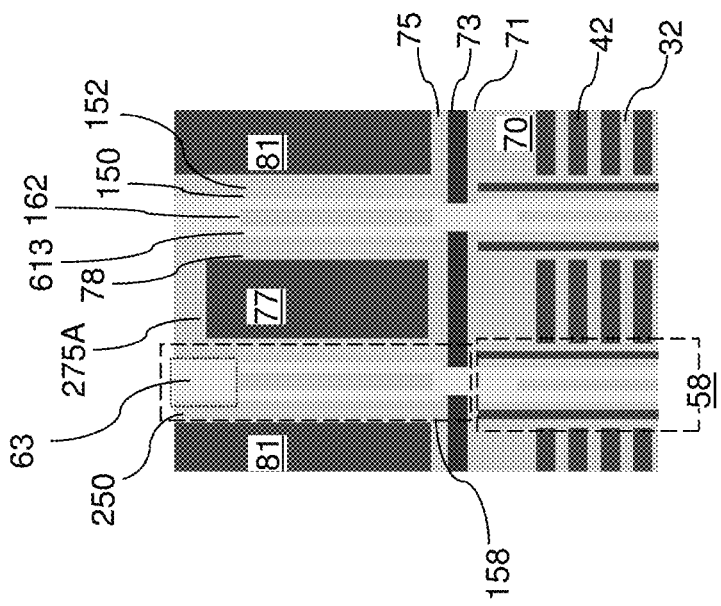
FIG. 22A is a vertical cross-sectional view of the exemplary structure after formation of drain regions according to an embodiment of the present disclosure.
Figure 22B:
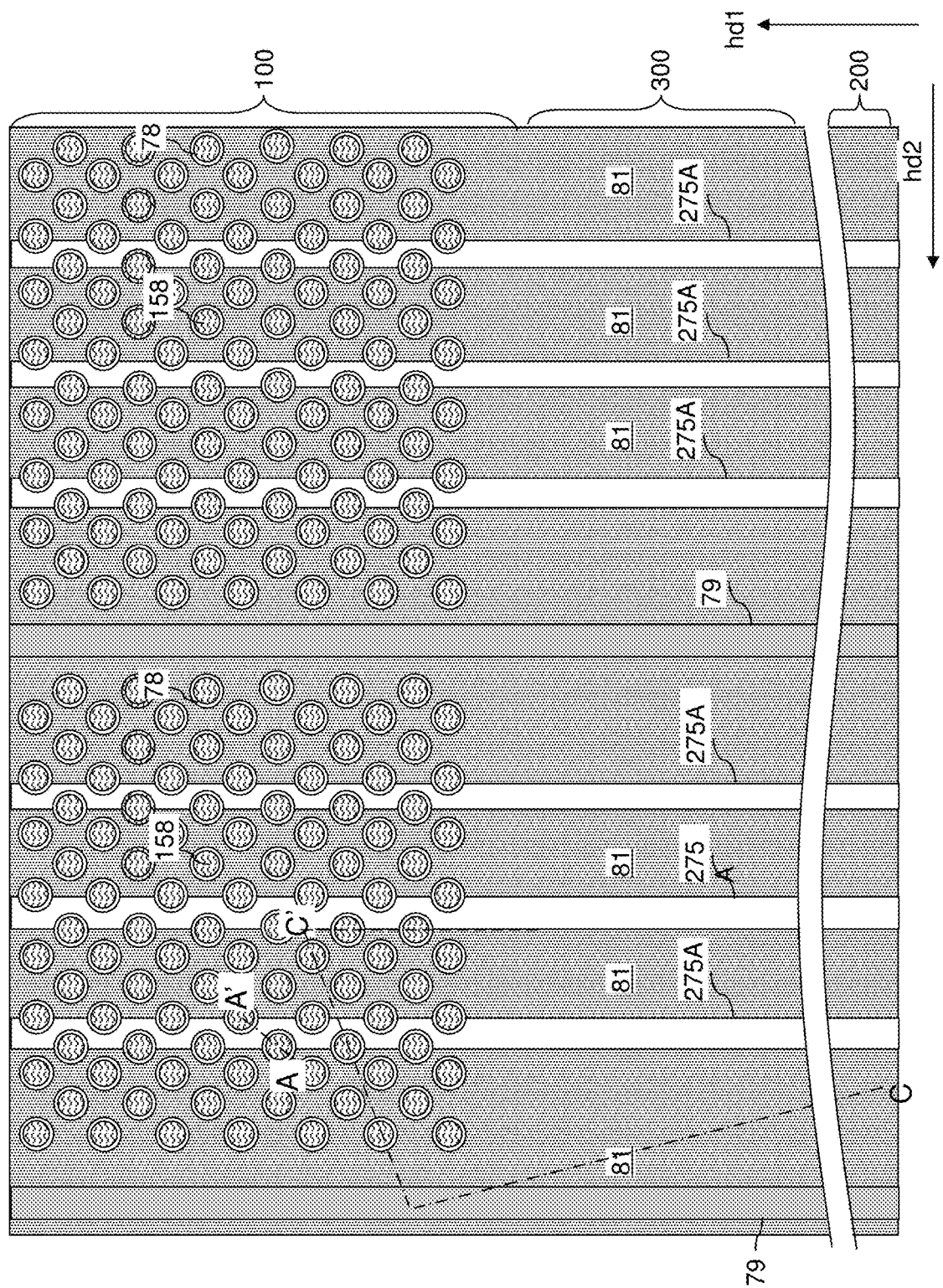
FIG. 22B is a top-down view of the exemplary structure of FIG. 22A. The vertical plane A-A' is the plane of the vertical cross-sectional view of FIG. 22A.
Figure 22C:
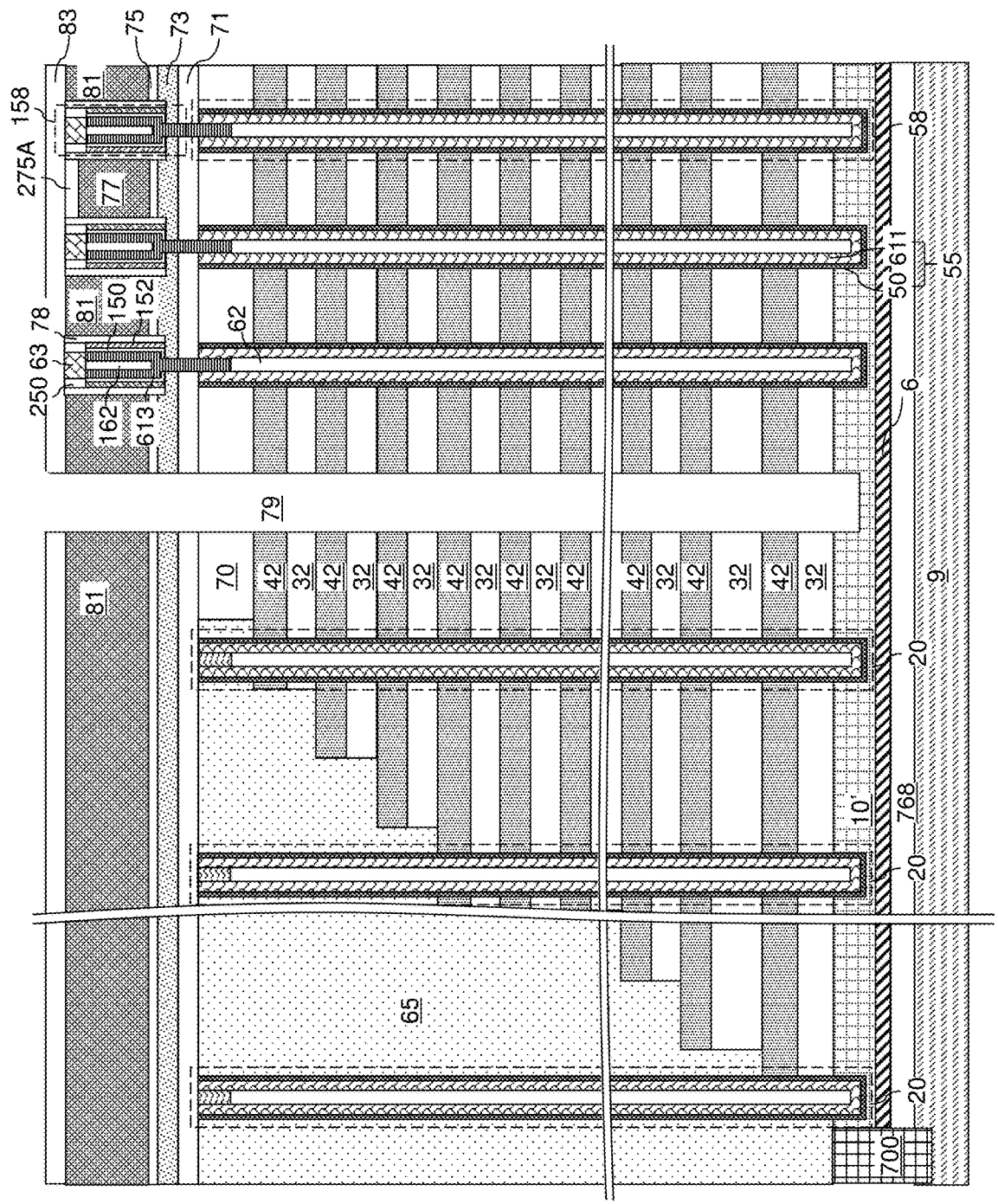
FIG. 22C is a vertical cross-sectional view of the exemplary structure along place C-C'.

Referring to FIGS. 22A-22C, a doped semiconductor material having a doping of the second conductivity type (which is the opposite of the first conductivity type) can be deposited in cavities overlying a respective drain-select-level channel 613 and laterally surrounded by a respective dielectric drain spacer 250. Portions of the deposited doped semiconductor material overlying the horizontal plane including the top surface of the sacrificial fill material layer 81 can be removed by a planarization process, which can include a recess etch and/or chemical mechanical planarization. Remaining portions of the doped semiconductor material constitute drain regions 63. Atomic concentration of dopants of the second conductivity type in the drain regions 63 can be in a range from $5.0 \times 10^{19}/cm^3$ to $2.0 \times 10^{21}/cm^3$, although lesser and greater atomic concentrations can also be employed. The thinner second portions 275B of the dielectric cap 275 are also removed during planarization to expose the upper surface of the sacrificial fill material layer 81. However, at least parts of the thicker first portions 275A of the dielectric cap 275 remain over the template rail structures 77.

Each contiguous combination of a cylindrical gate electrode 152, a gate dielectric 150, a drain-select-level channel 613, a drain-select-level dielectric core 162, a dielectric drain spacer 250, and a drain region 63 constitutes a drain-select-level pillar structure 158. Each drain-select-level pillar structure 158 is laterally surrounded by a respective cylindrical dielectric spacer 78, and is formed within a respective one of the drain-select-level openings 149. Thus, each drain-select-level pillar structure 158 comprises a cylindrical gate dielectric 150 laterally surrounding a respective one of the drain-select-level channels 613 and a cylindrical gate electrode 152 laterally surrounding the cylindrical gate dielectric 150. Each drain-select-level pillar structure 158 is formed over, and directly on, a respective memory stack structure 55. Specifically, each of the drain-select-level pillar structures 158 comprises a drain-select-level channel 613 contacting an underlying one of the memory stack structures 55.

In one embodiment, the drain-select-level pillar structures 158 are arranged in rows that extend along the first horizontal direction hd1, and a row-to-row pitch p is the same for each neighboring pairs of rows of the drain-select-level pillar structures 158. In one embodiment, the drain-select-level pillar structures 158 are arranged as a first two-dimensional hexagonal array, and the memory stack structures 55 are arranged as a second two-dimensional hexagonal array having a same two-dimensional periodicity as the first two-dimensional hexagonal array. Each sidewall of the template rail structures 77 that extends along the first horizontal direction hd1 is perforated by a respective row of drain-select-level pillar structures 158.

Referring to FIGS. 22B and 22C, a sacrificial cover layer 83 can be deposited over the sacrificial fill material layer 81, the first portions 275A of the dielectric cap 275 located over the template rail structures 77, and the drain regions 63. The sacrificial cover layer 83 includes a material that protects the sacrificial fill material layer 81 and the template rail structures 77 during subsequent replacement process that replaces the sacrificial material layers 42 with electrically conductive layers. For example, the sacrificial cover layer 83 can include silicon oxide. The thickness of the sacrificial cover layer 83 can be in a range from 10 nm to 300 nm, although lesser and greater thicknesses can also be employed.

Referring to FIGS. 22B and 22C, backside trenches 79 vertically extending from the top surface of the sacrificial cover layer 83 to the source-level sacrificial layer 104 can be formed, for example, by applying and patterning a photoresist layer to form line trench patterns therein, and by transferring the pattern in the photoresist layer through various material portions of the exemplary structure down to the source-level sacrificial layer 104. The photoresist layer is subsequently removed, for example, by ashing. The backside trenches 79 can laterally extend along the first horizontal direction hd1.

Figure 23A:
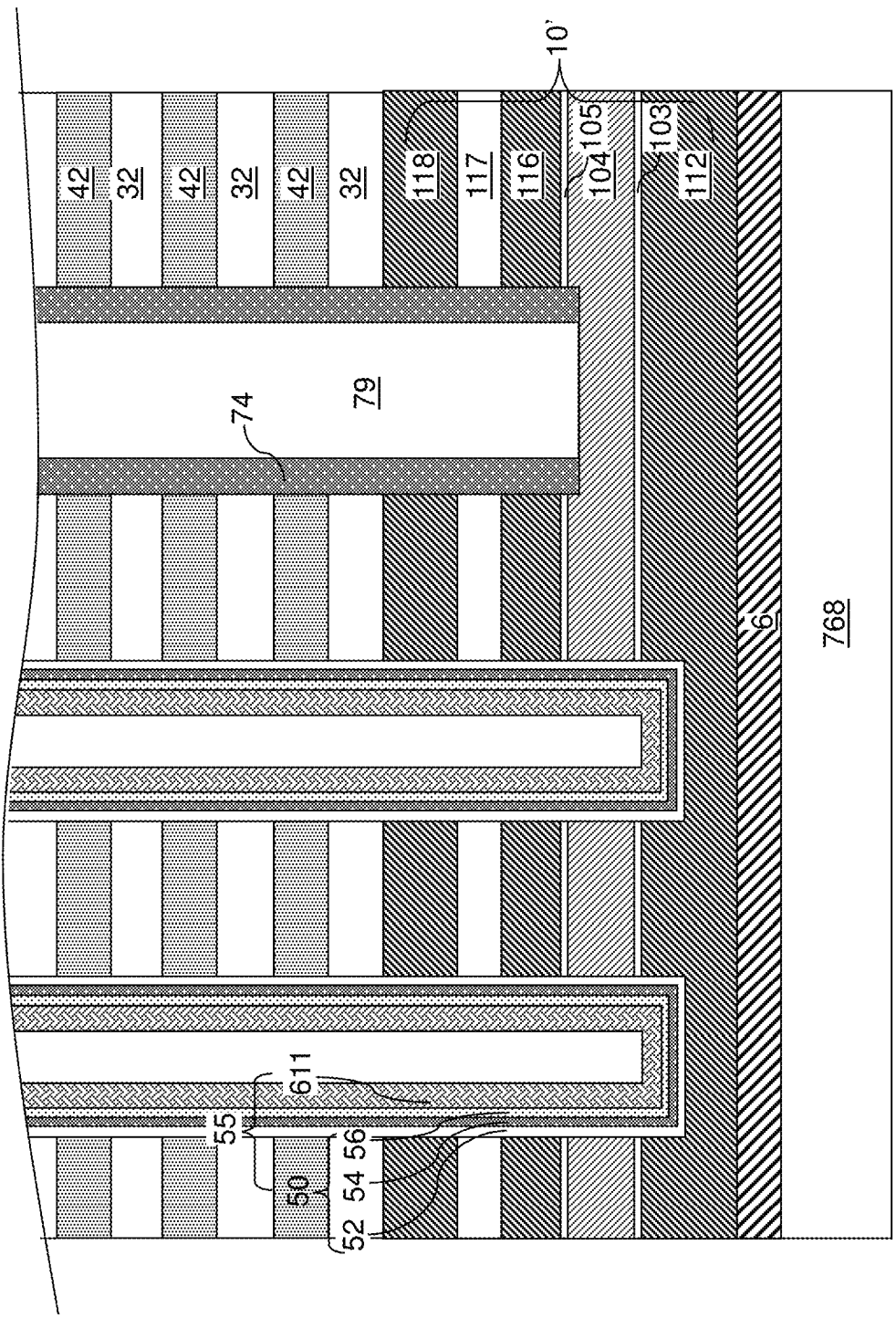
FIGS. 23A-23H are sequential vertical cross-sectional views of a region of the exemplary structure during replacement of the in-process source level material layers with source level material layers according to an embodiment of the present disclosure.

Referring to FIG. 23A, an etch stop material can be conformally deposited and anisotropically etched to form a backside trench spacer 74 within each backside trench 79. The backside trench spacers 74 are sacrificial spacers that protect the alternating stack (32, 42) during replacement of the in-process source-level material layers 10' with source-level material layers 10. In one embodiment, the backside trench spacers 74 include silicon nitride. The thickness of the backside trench spacers 74 can be in a range from 2 nm to 20 nm, such as from 3 nm to 10 nm, although lesser and greater thicknesses can also be employed.

Figure 23B:
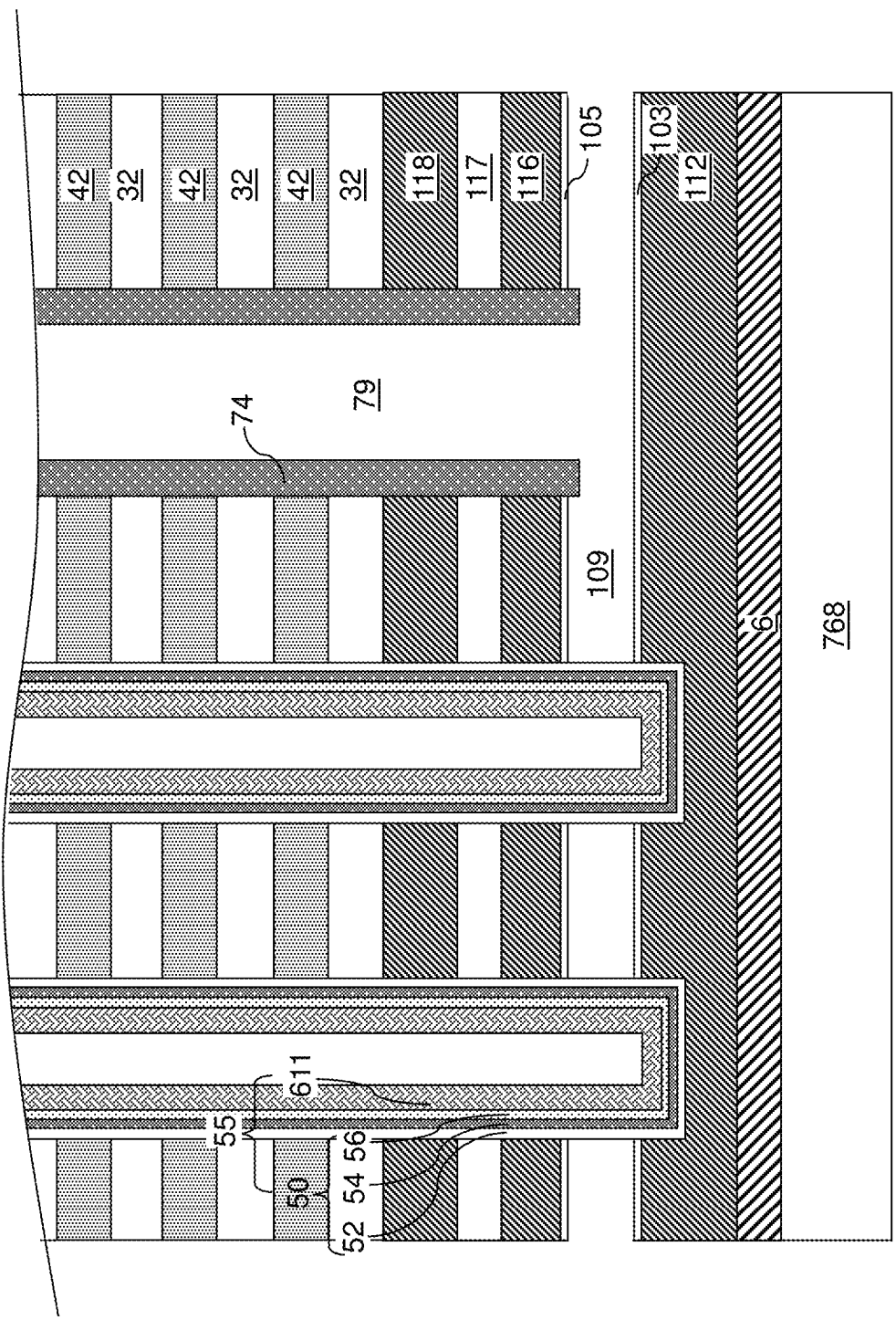

Referring to FIG. 23B, an etchant that etches the material of the source-level sacrificial layer 104 selective to the materials of the alternating stack (32, 42), the insulating cap layer 70, and the dielectric matrix structure 72 can be introduced into the backside trenches in an isotropic etch process. For example, if the source-level sacrificial layer 104 includes undoped amorphous silicon or an undoped amorphous silicon-germanium alloy, the backside trench spacers 74 include silicon nitride, and the upper and lower sacrificial liners (105, 103) include silicon oxide, a wet etch process employing hot trimethyl-2 hydroxyethyl ammonium hydroxide ("hot TMY") or tetramethyl ammonium hydroxide (TMAH) can be employed to remove the source-level sacrificial layer 104 selective to the backside trench spacers 74 and the upper and lower sacrificial liners (105, 103). A source cavity 109 is formed in the volume from which the source-level sacrificial layer 104 is removed.

Figure 23C:
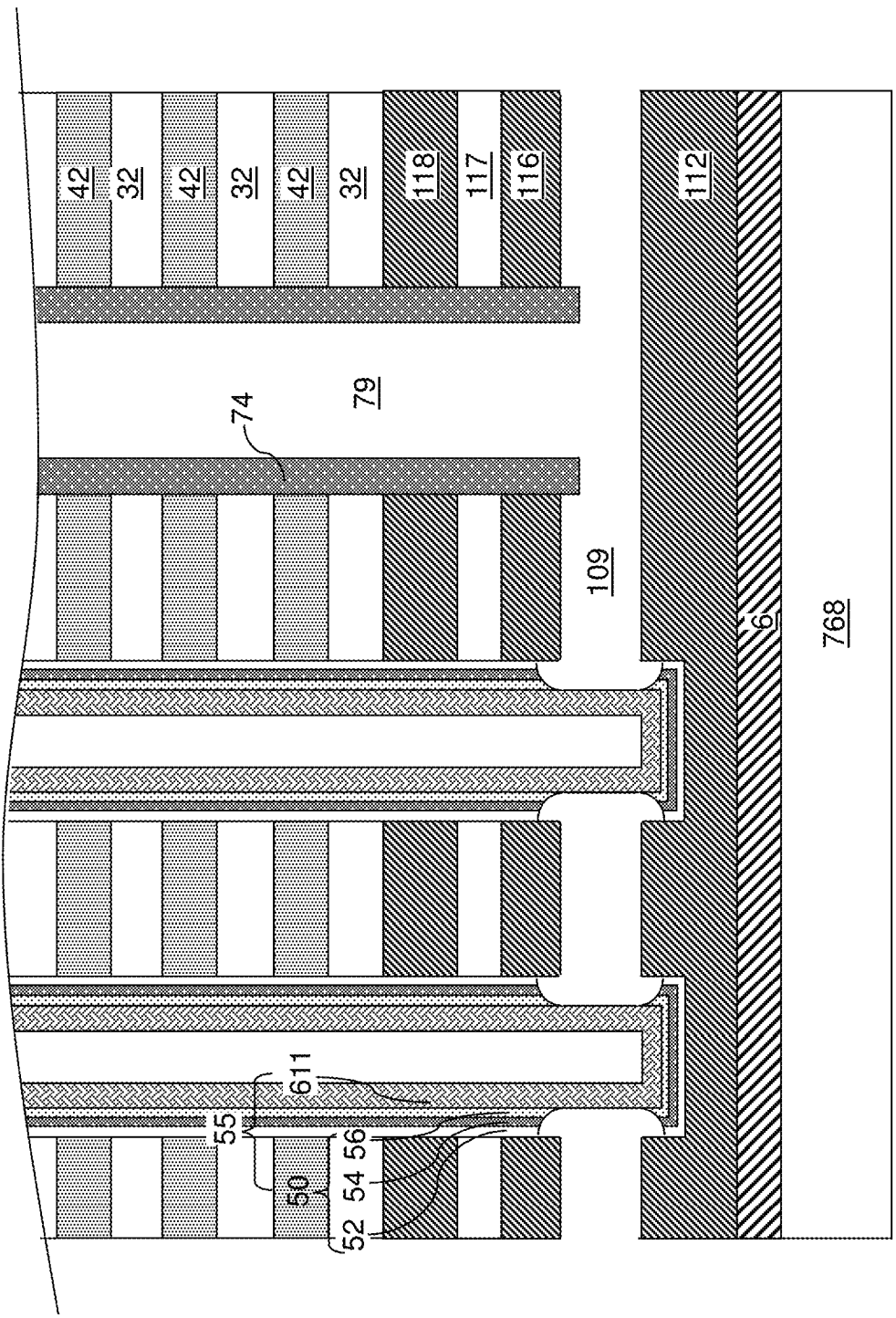

Referring to FIG. 23C, a sequence of isotropic etchants, such as wet etchants, can be applied to the physically exposed portions of the memory films 50 to sequentially etch the various component layers of the memory films 50 from outside to inside, and to physically expose cylindrical surfaces of the vertical semiconductor channels 611 at the level of the source cavity 109. The upper and lower sacrificial liners (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower sacrificial liners (105, 103). A top surface of the lower source layer 112 and a bottom surface of the upper source layer 116 can be physically exposed to the source cavity 109.

Figure 23D:
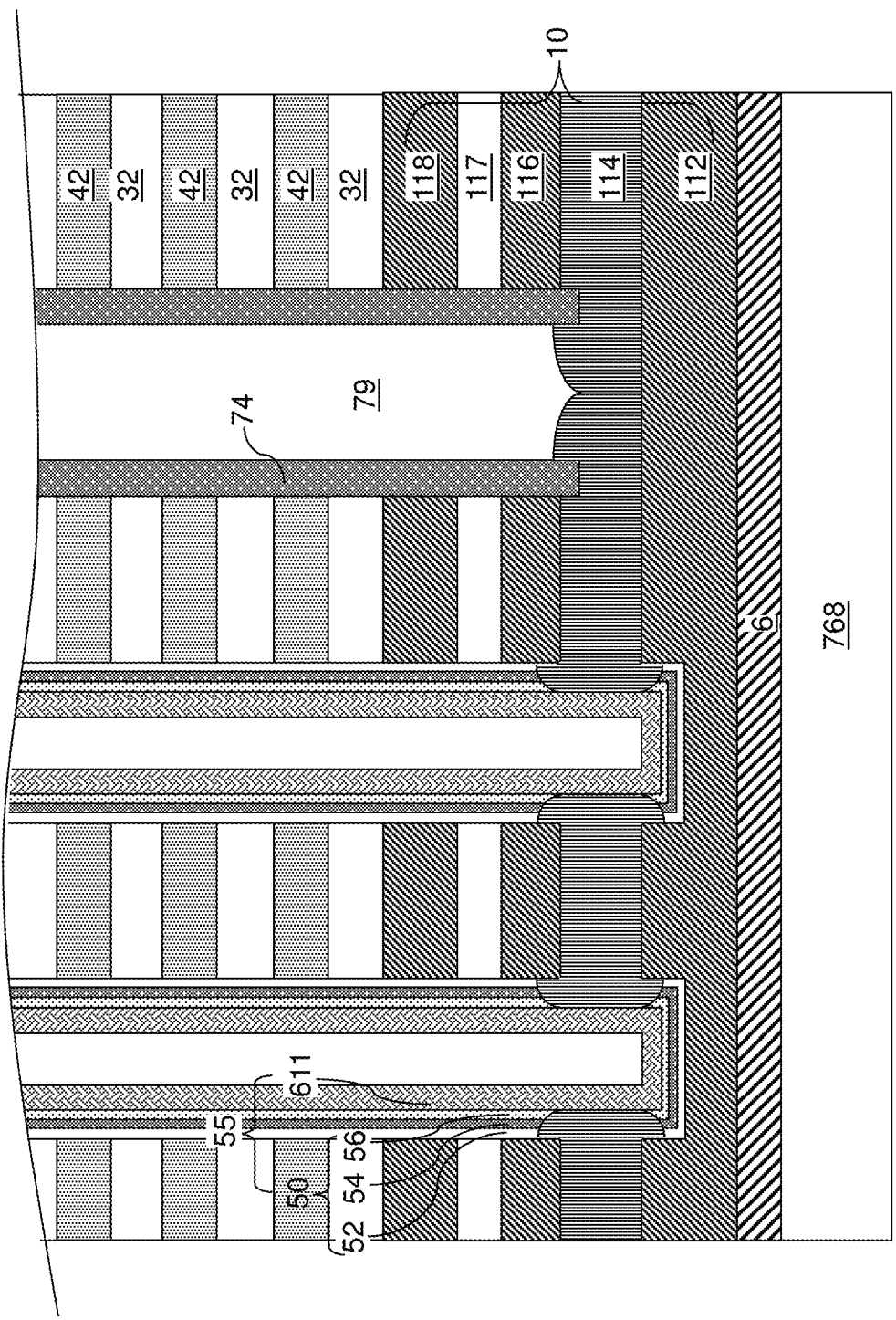

Referring to FIG. 23D, a doped semiconductor material having a doping of the second conductivity type can be deposited by a selective semiconductor deposition process. A semiconductor precursor gas, an etchant, and a dopant precursor gas can be flowed concurrently into a process chamber including the exemplary structure during the selective semiconductor deposition process. For example, if the second conductivity type is n-type, a semiconductor precursor gas such as silane, disilane, or dichlorosilane, an etchant gas such as hydrogen chloride, and a dopant precursor gas such as phosphine, arsine, or stibine. The deposited doped semiconductor material forms a source contact layer 114, which can contact sidewalls of the vertical semiconductor channels 611. The duration of the selective semiconductor deposition process can be selected such that the source cavity is filled with the source contact layer 114, and the source contact layer 114 contacts bottom end portions of inner sidewalls of the backside trench spacers 74. Thus, the source contact layer 114 can be formed by selectively depositing a doped semiconductor material from semiconductor surfaces around the source cavity 109. In one embodiment, the doped semiconductor material can include doped polysilicon.

The layer stack including the lower source layer 112, the source contact layer 114, and the upper source layer 116 constitutes a buried source layer (112, 114, 116), which functions as a common source region that is connected each of the vertical semiconductor channels 611 and has a doping of the second conductivity type. The average dopant concentration in the buried source layer (112, 114, 116) can be in a range from $5.0 \times 10^{19}/cm^3$ to $2.0 \times 10^{21}/cm^3$, although lesser and greater dopant concentrations can also be employed. The set of layers including the buried source layer (112, 114, 116), the source-level insulating layer 117, and the optional source-select-level conductive layer 118 constitutes source-level material layers 10, which replaces the in-process source-level material layers 10'. Optionally, an oxidation process can be performed to convert a surface portion of the source contact layer 114 into a semiconductor oxide portion (not illustrated) underneath each backside trench 79.

Figure 23E:
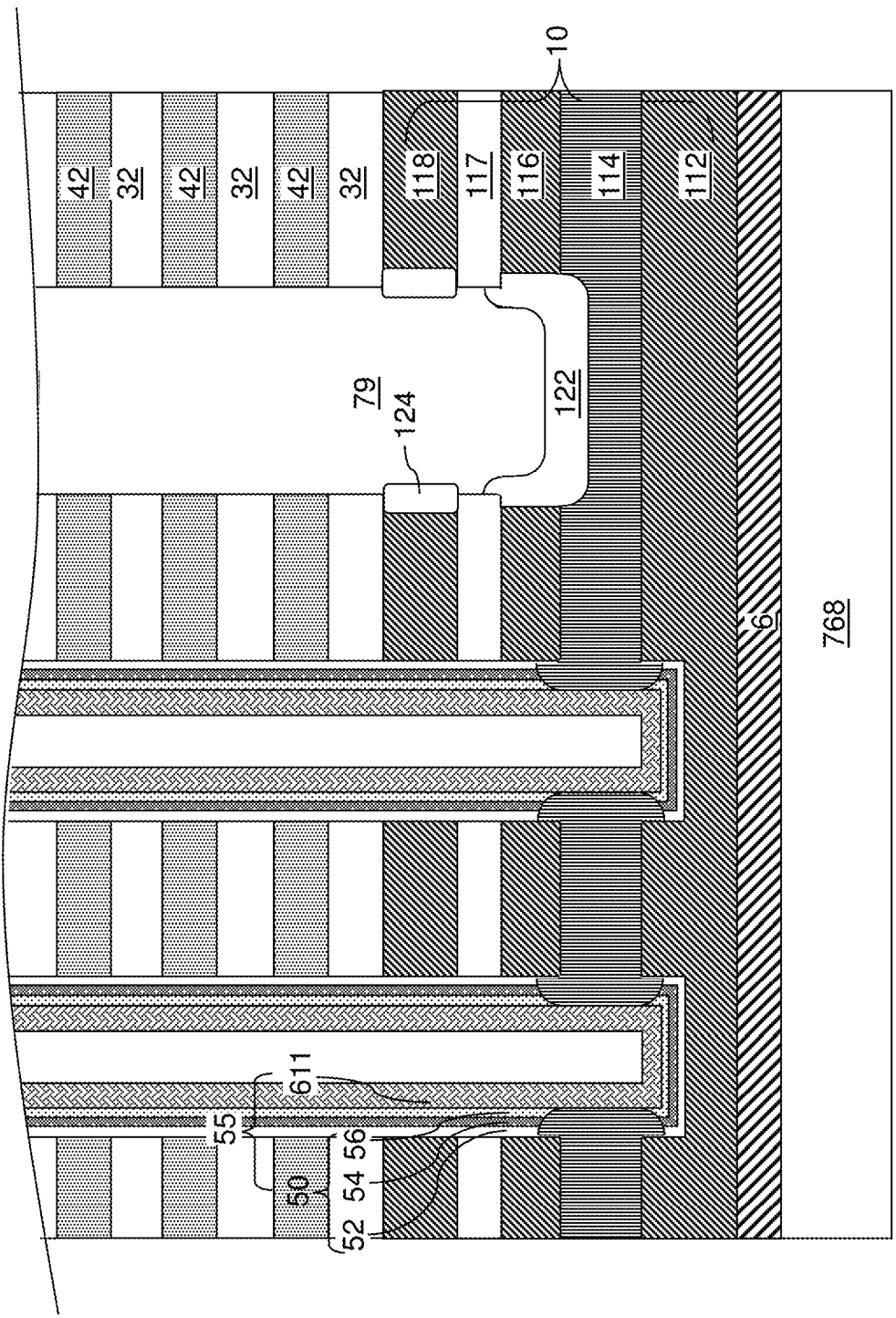

Referring to FIG. 23E, the backside trench spacers 74 can be removed selective to the insulating layers 32, the insulating cap layer 70, and the source contact layer 114 employing an isotropic etch process. For example, if the backside trench spacers 74 include silicon nitride, a wet etch process employing hot phosphoric acid can be performed to remove the backside trench spacers 74. In one embodiment, the isotropic etch process that removes the backside trench spacers 74 can be combined with a subsequent isotropic etch process that etches the sacrificial material layers 42 selective to the insulating layers 32, the insulating cap layer 70, and the source contact layer 114.

An oxidation process can be performed to convert physically exposed surface portions of semiconductor materials into dielectric semiconductor oxide portions. For example, surfaces portions of the source contact layer 114 and the upper source-level material layer 116 can be converted into dielectric semiconductor oxide plates 122, and surface portions of the optional source-select-level conductive layer 118 can be converted into annular dielectric semiconductor oxide spacers 124.

Figure 23F:
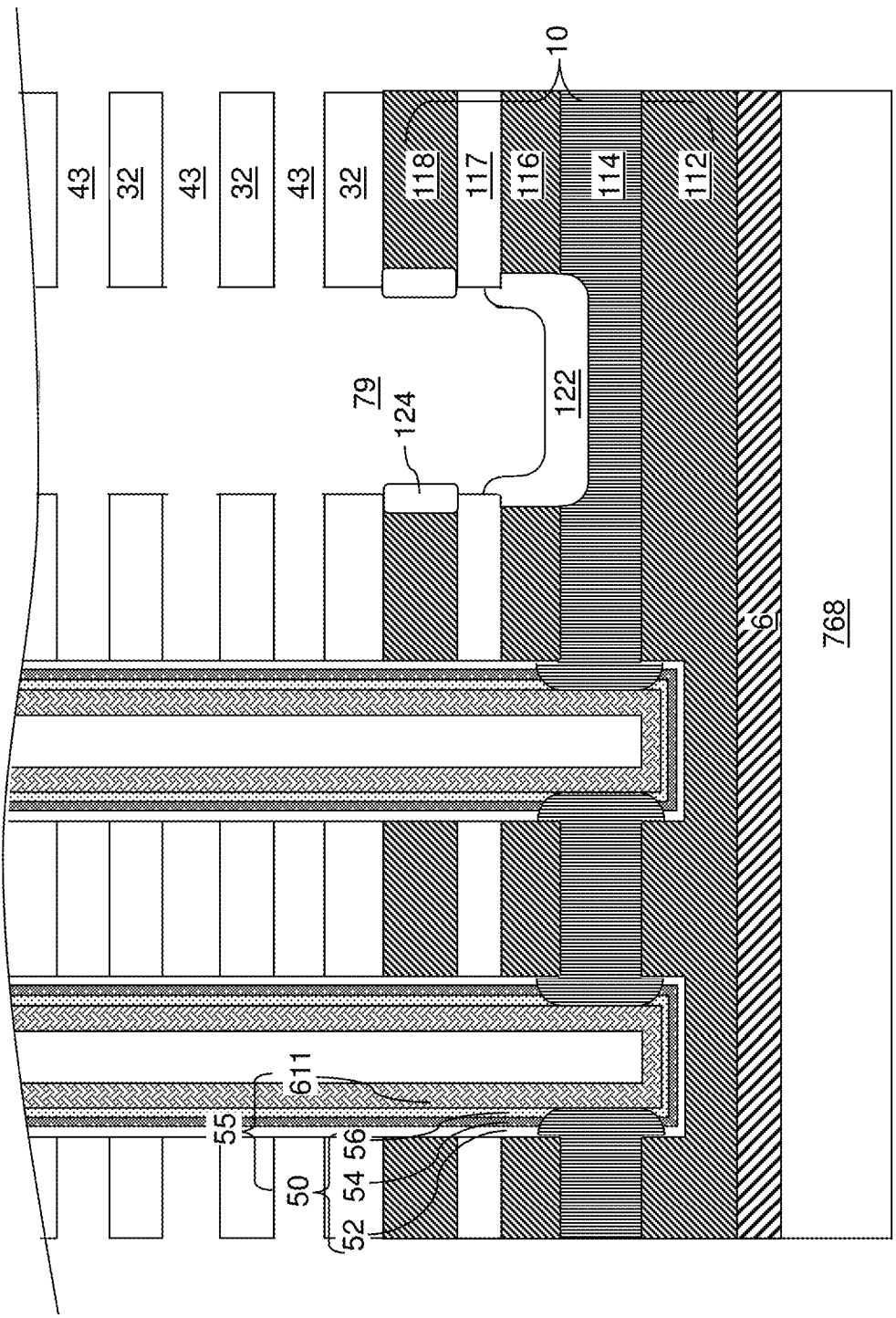

Referring to FIG. 23F, the sacrificial material layers 42 are can be removed selective to the insulating layers 32, the insulating cap layer 70, the source contact layer 114, the dielectric semiconductor oxide plates 122, and the annular dielectric semiconductor oxide spacers 124. For example, an etchant that selectively etches the materials of the sacrificial material layers 42 with respect to the materials of the insulating layers 32, the insulating cap layer 70, the retro-stepped dielectric material portion 65 (illustrated in FIG. 22A), and the material of the outermost layer of the memory films 50 can be introduced into the backside trenches 79, for example, employing an isotropic etch process. For example, the sacrificial material layers 42 can include silicon nitride, the materials of the insulating layers 32, the insulating cap layer 70, the retro-stepped dielectric material portion 65, and the outermost layer of the memory films 50 can include silicon oxide materials.

The isotropic etch process can be a wet etch process employing a wet etch solution, or can be a gas phase (dry) etch process in which the etchant is introduced in a vapor phase into the backside trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art.

Each of the backside recesses 43 can be a laterally extending cavity having a lateral dimension that is greater than the vertical extent of the cavity. In other words, the lateral dimension of each of the backside recesses 43 can be greater than the height of the respective backside recess 43. A plurality of backside recesses 43 can be formed in the volumes from which the material of the sacrificial material layers 42 is removed. Each of the backside recesses 43 can extend substantially parallel to the top surface of the substrate semiconductor layer 9. A backside recess 43 can be vertically bounded by a top surface of an underlying insulating layer 32 and a bottom surface of an overlying insulating layer 32. In one embodiment, each of the backside recesses 43 can have a uniform height throughout.

Figure 23G:
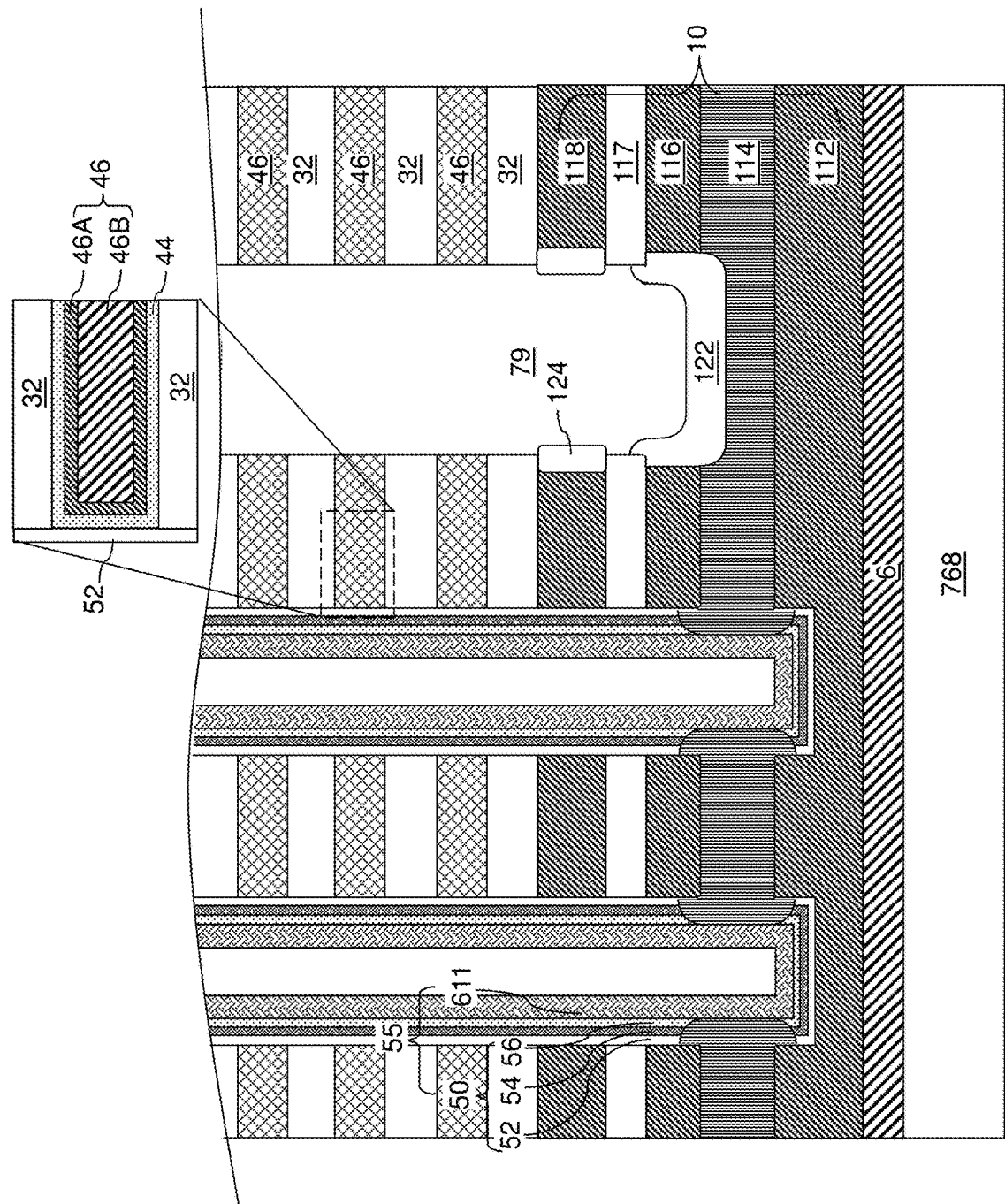

Referring to FIG. 23G, a backside blocking dielectric layer 44 can be subsequently formed in the backside recesses 43. The backside blocking dielectric layer 44 can include at least one dielectric material that is subsequently employed to prevent charge tunneling between the charge storage layers 54 and electrically conductive layers to be subsequently formed in the backside recesses 43. For example, the backside blocking dielectric layer 44 can include silicon oxide and/or a dielectric metal oxide such as aluminum oxide. The backside blocking dielectric layer 44 can be formed by a conformal deposition process such as chemical vapor deposition or atomic layer deposition. The thickness of the backside blocking dielectric layer 44 can be in a range from 1 nm to 6 nm, such as 2 nm to 4 nm, although lesser and greater thicknesses can also be employed.

At least one metallic material can be subsequently deposited in the backside recesses 43 and at peripheral portions of the backside trenches 79. For example, a metallic barrier layer 46A can be conformally deposited in the backside recesses 43, for example, by chemical vapor deposition. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Subsequently, a metal fill material is deposited in the plurality of backside recesses 43, on the sidewalls of the at least one backside trench 79, and over the top surface of the insulating cap layer 70 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. Alternatively, the metallic fill material layer 46B can include a different metallic material such as cobalt, ruthenium, and/or molybdenum. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of word-line-level electrically conductive layers 46 can be formed in the plurality of backside recesses 43, and a continuous metallic material layer can be formed on the sidewalls of each backside trench 79 and over the insulating cap layer 70. Each word-line-level electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer includes a continuous portion of the metallic barrier layer 46A and a continuous portion of the metallic fill material layer 46B that are located in the backside trenches 79 or above the insulating cap layer 70.

The deposited metallic material of the continuous electrically conductive material layer is etched back from the sidewalls of each backside trench 79 and from above the insulating cap layer 70, for example, by an isotropic wet etch, an anisotropic dry etch, or a combination thereof. Each remaining portion of the deposited metallic material in the backside recesses 43 constitutes a word-line-level electrically conductive layer 46. Each word-line-level electrically conductive layer 46 can be a conductive line structure. Thus, the sacrificial material layers 42 are replaced with the word-line-level electrically conductive layers 46.

Each word-line-level electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each word-line-level electrically conductive layer 46 are the control gate electrodes for the vertical memory devices including the memory stack structures 55. In other words, each word-line-level electrically conductive layer 46 can be a word line that functions as a common control gate electrode, or a select gate electrode, for the plurality of vertical memory devices.

Figure 23H:
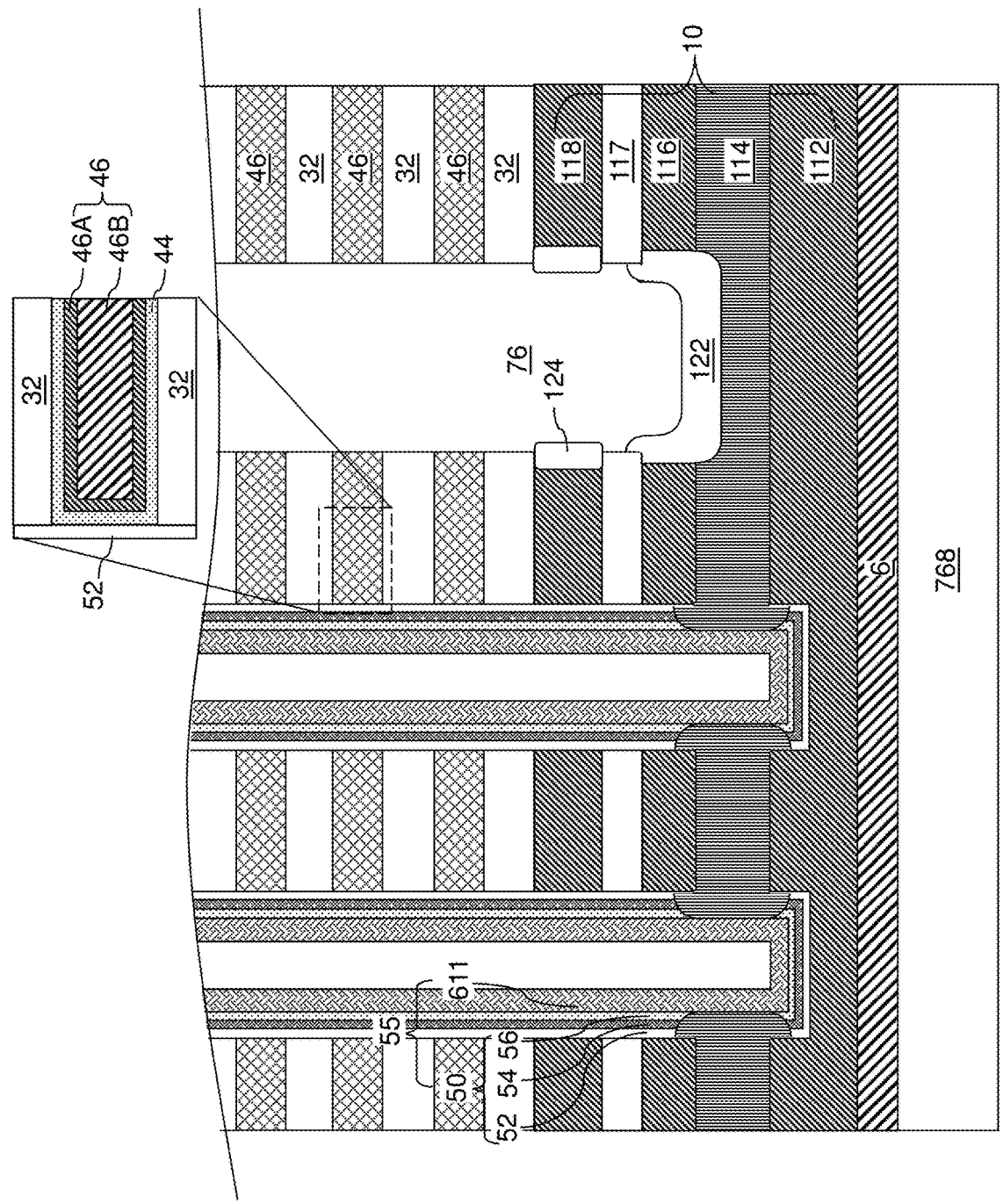
Figure 24:
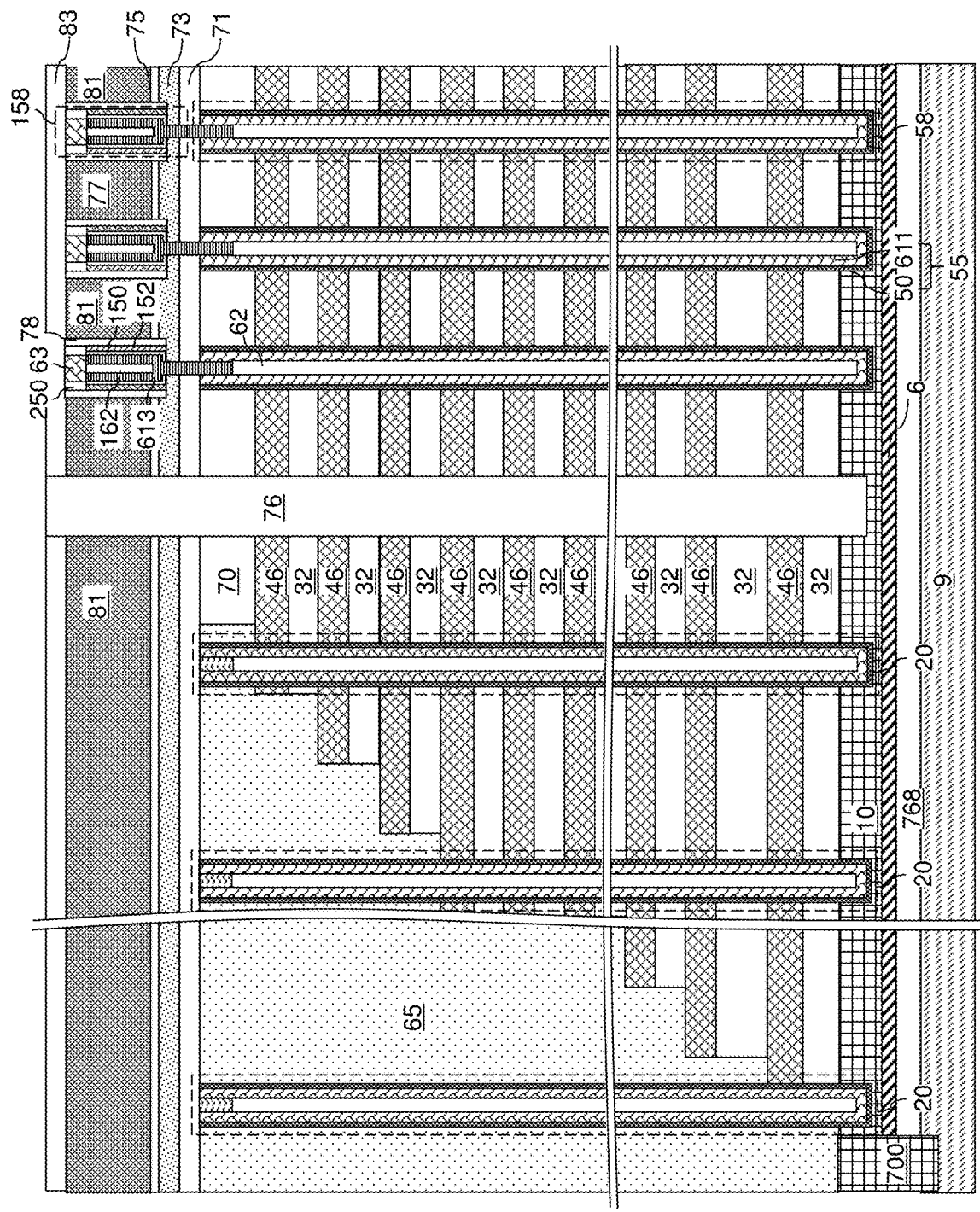
FIG. 24 is a vertical cross-sectional view of the exemplary structure after formation of dielectric wall structures in the backside trenches according to an embodiment of the present disclosure.

Referring to FIGS. 23H and 24, a dielectric material is deposited in the backside trenches 79 to form dielectric wall structures 76. Each of the dielectric wall structures 76 can laterally extend along the first horizontal direction hd1 and can vertically extend through each layer of an alternating stack of the insulating layers 32 and the word-line-level electrically conductive layers 46. Each dielectric wall structure 76 can contact sidewalls of the insulating cap layer 70.

Figure 25:
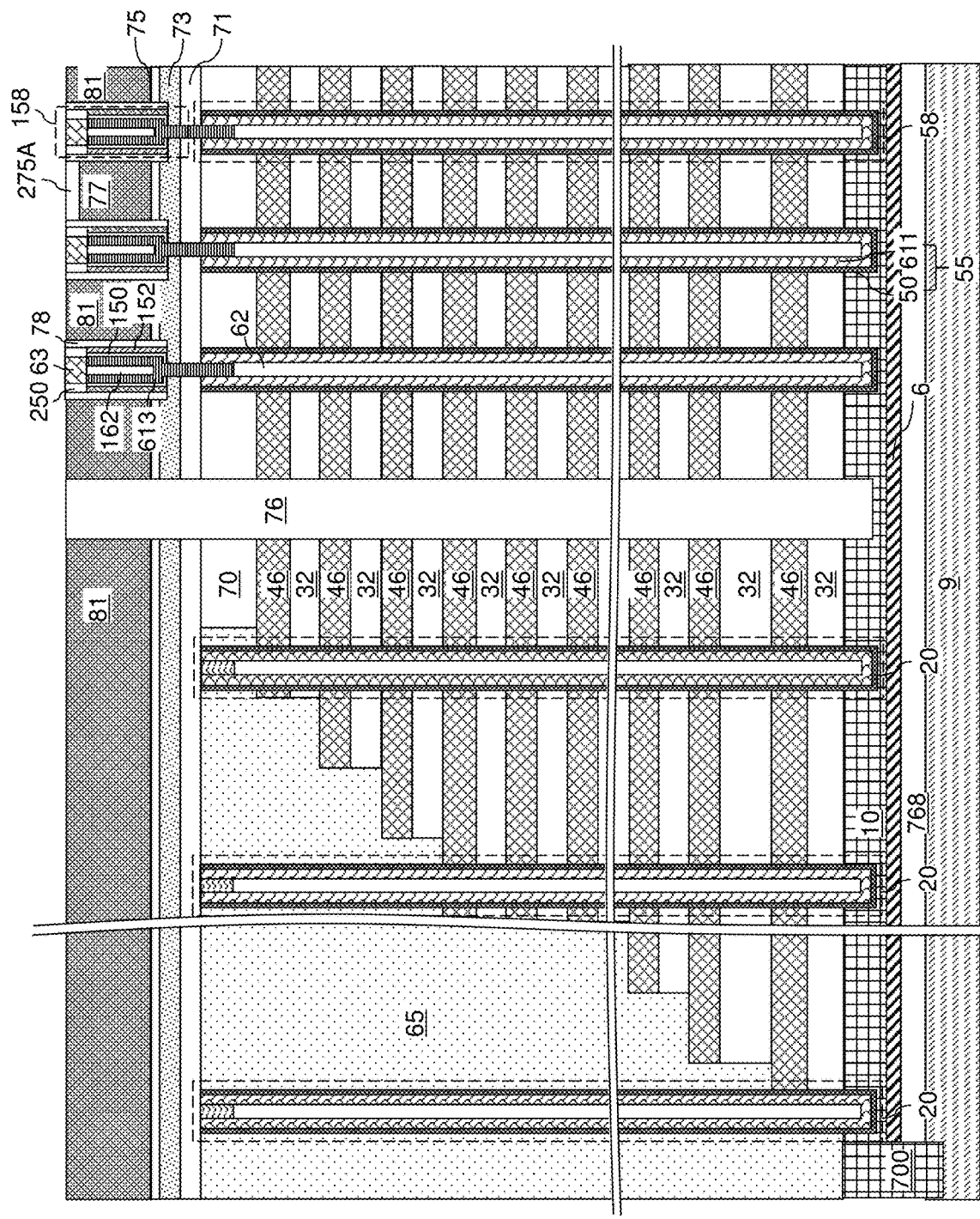
FIG. 25 is a vertical cross-sectional view of the exemplary structure after removal of the sacrificial cover layer according to an embodiment of the present disclosure.

Referring to FIGS. 25 and 26 the sacrificial cover layer 83 can be removed by a selective etch process to physically expose top surfaces of sacrificial fill material layer 81, the first portions 275A of the dielectric cap 275 located on the template rail structures 77 and the drain regions 63. For example, if the sacrificial cover layer 83 includes silicon oxide, a wet etch process employing dilute hydrofluoric acid can be employed to remove the sacrificial cover layer 83.

Referring to FIG. 27, the exposed sacrificial fill material layer 81 is removed by selective etching, such as by hot phosphoric acid etching to form openings 85. The first portions 275A of the dielectric cap 275 cover the template rail structures 77 such that the template rail structures 77 are not removed.

Upon removal of the sacrificial fill material layer 81 without removing the template rail structures 77, first portions of the cylindrical dielectric spacers 78 that were previous in contact with the sacrificial fill material layer 81 are physically exposed in the openings 85, while second portions of the cylindrical dielectric spacers 78 that are in contact with the template rail structures 77 are located between the template rail structures 77 and neighboring ones of the drain-select-level pillar structures 158.

Subsequently, the first portions of the cylindrical dielectric spacers 78 exposed in the openings 85 are removed by selective etching, such as a dilute HF etch, which also etches part of the remaining first portion 275A of the dielectric cap 275. Remaining second portions of the cylindrical dielectric spacers 78 between the template rail structures 77 and the cylindrical gate electrode 152 are not removed, since they are protected by the first portion 275A of the dielectric cap 275. The remaining second portions of the cylindrical dielectric spacers constitute dielectric cylindrical segments 78'. As used herein, a "cylindrical segment" refers to a structure obtained by removing a portion of a cylindrical structure. In this case, each of the dielectric cylindrical segments 78' can azimuthally extend by less than 270 degrees, and/or less than 180 degrees, and/or less than 135 degrees from a respective vertical axis including the center of curvature including an inner concave cylindrical surface portion of the dielectric cylindrical segment 78'.

Referring to FIG. 28 drain-select-level electrode strips 146 are formed in the openings 85 by deposition of at least one conductive material. For example, at least one conductive material can include a combination of a metallic barrier layer and a metal fill material. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN. The metal fill material can be deposited on the metallic barrier layer to fill remaining volumes of the laterally-extending trenches 87. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal.

A recess etch can be performed to recess the at least one conductive material such that top surfaces of the recessed portions of the at least one conductive material are formed below the horizontal plane including the top surfaces of the drain regions 63. Each recessed discrete portion of the recessed conductive material constitutes a drain-select-level electrode strip 146. The drain-select-level electrode strips 146 are formed in volumes from which the sacrificial fill material layer 81 is removed. The drain-select-level electrode strips 146 are formed over the alternating stack (32, 46) and between neighboring pairs of the template rail structures 77 and have a height (i.e., thickness) of about 100 nm to about 200 nm.

Each drain-select-level electrode strip 146 contacts outer sidewalls of a respective set of cylindrical gate electrodes 152. Each cylindrical gate electrode 152 contacts a respective one of the drain-select-level electrode strips 146. The cylindrical gate electrodes 152 include first cylindrical gate electrodes 152 that contacts a respective one of the dielectric cylindrical segments 78' on one side and contacting a respective one of the drain-select-level electrode strips 146 on another side, and second cylindrical gate electrodes 152 that do not contact any of the dielectric cylindrical segments 78' and is laterally surrounded, i.e., encircled, by a respective one of the drain-select-level electrode strips 146. In one embodiment, each of the cylindrical gate electrodes 152 comprises a doped semiconductor material, and each of the drain-select-level electrode strips 146 comprises at least one metallic material. The combination of the pair of contacting cylindrical gate electrode 152 and drain-select-level electrode strip 146 constitutes a drain select gate electrode (146, 152) of a drain select transistor. The drain select transistor also includes a channel 613 and a gate dielectric 150 between the channel 613 and the drain select gate electrodes (146, 152).

Referring FIG. 29, the remaining parts of the first portions 275A of the dielectric caps 275 are removed by a selective etch, such as a dilute HF etch, to expose the top surfaces of the template rail structures 77.

Referring to FIG. 30, the exposed template rail structures 77 are removed selective to the drain-select-level electrode strips 146, the drain regions 63, the dielectric drain spacers 250, the dielectric cylindrical segments 78', and the dielectric wall structures 76. In one embodiment, the template rail structures 77 can include silicon nitride, and an isotropic etch process using hot phosphoric acid can be employed to remove the template rail structures 77. Laterally-extending trenches 87 can be formed in volumes from which the template rail structures 77 are removed. Each laterally-extending trench 87 includes a pair of sidewalls that generally extends along the first horizontal direction hd1. Each sidewall of the laterally-extending trenches 87 includes a laterally alternating sequence of each of the pair of sidewalls comprises straight sidewall segments that extend along the first horizontal direction hd1 and convex segments that laterally protrude inward from a vertical plane including the straight sidewall segments. The straight sidewall segments include planar vertical sidewall segments of a respective drain-select-level electrode strip 146. The convex segments include convex cylindrical sidewall segments of the dielectric cylindrical segments 78'.

Figure 31B:
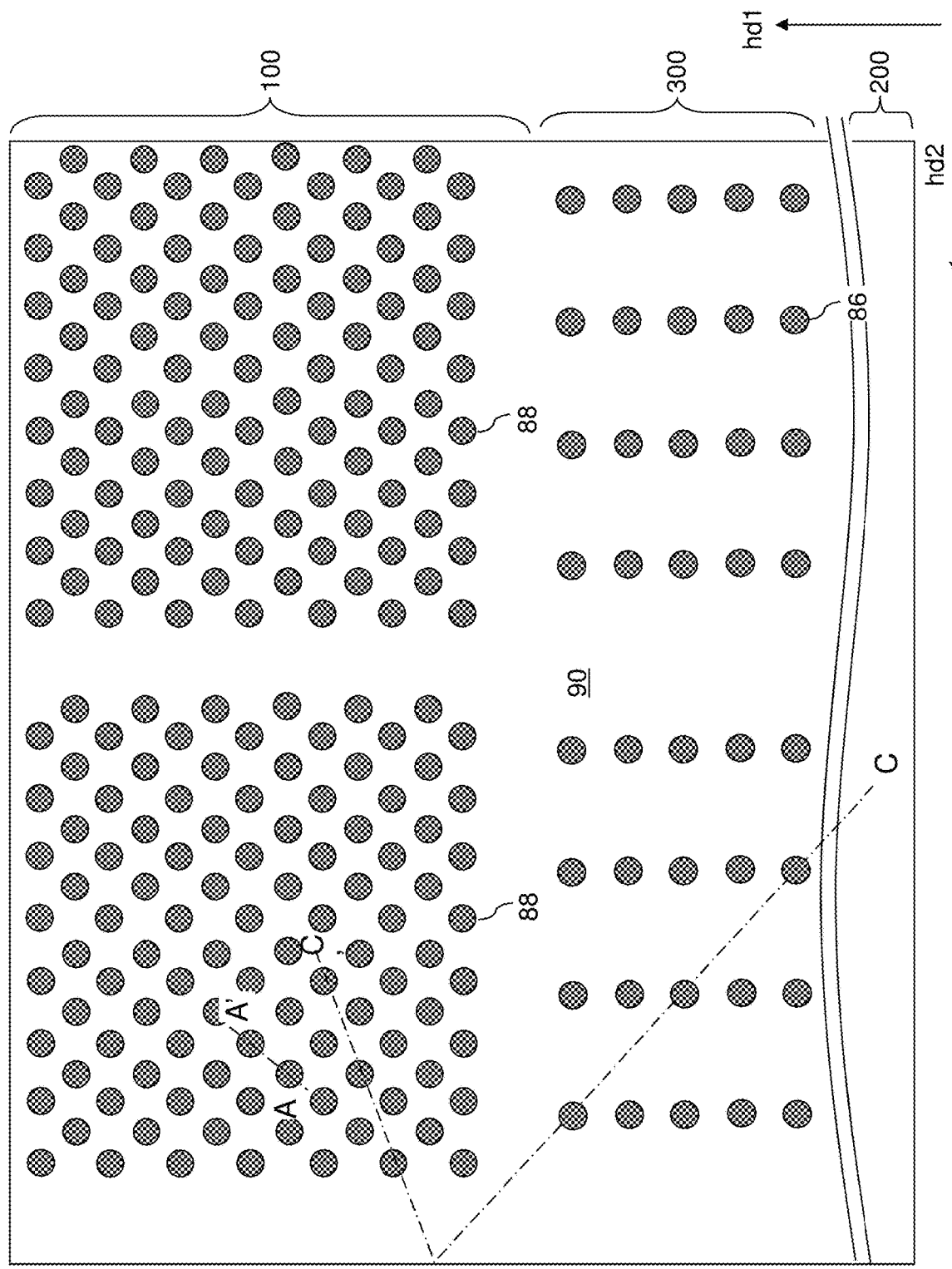
FIG. 31B is a top-down view of the exemplary structure of FIG. 31A. The vertical plane A-A' is the plane of the vertical cross-sectional view of FIG. 31A.
Figure 31C:
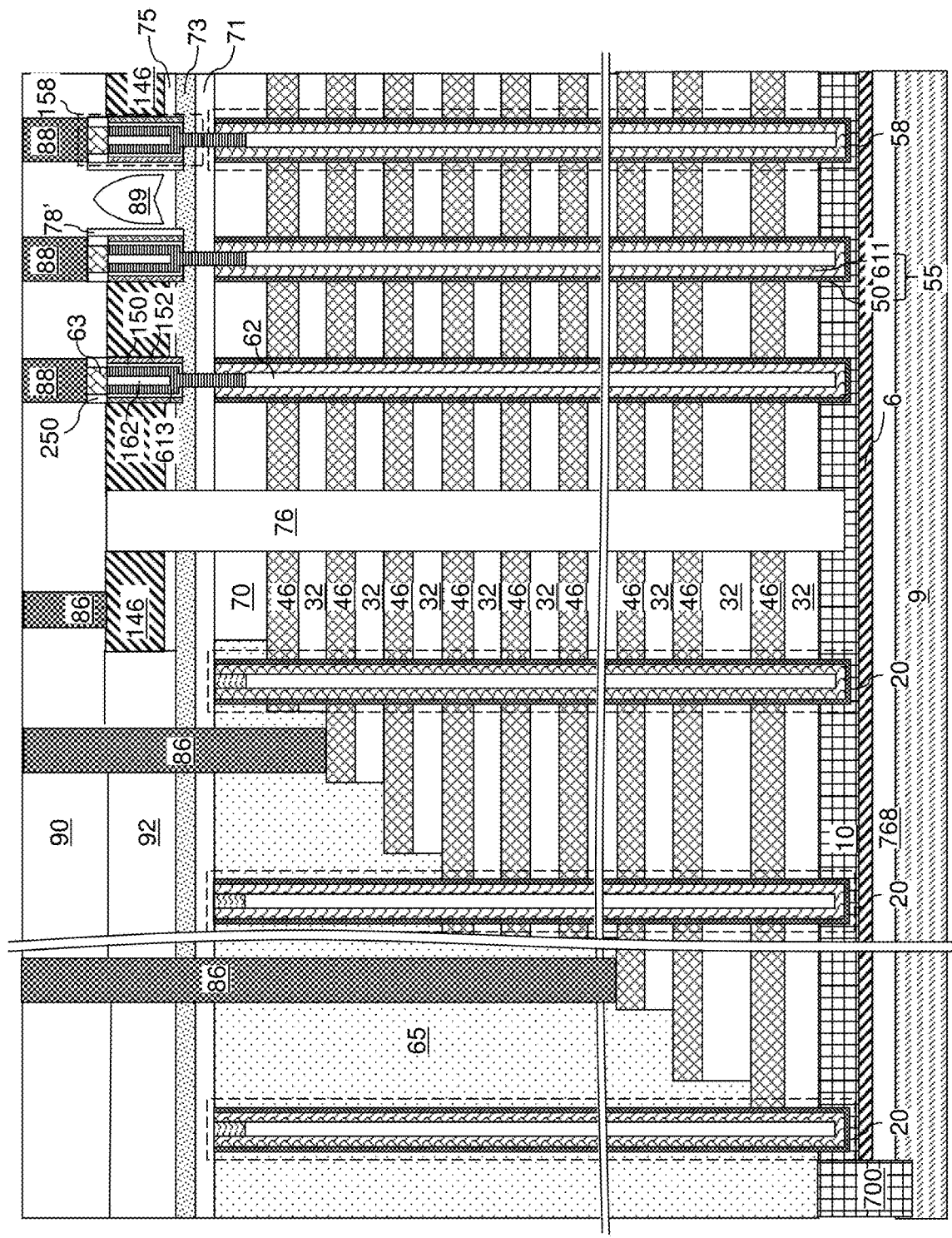
FIG. 31C is a vertical cross-sectional view of the exemplary structure of FIG. 31B along the hinged vertical plane C-C'.

Referring to FIGS. 31A-31C, a dielectric material such as silicon oxide or organosilicate glass can be deposited by a non-conformal deposition process over the drain-select-level electrode strips 146. For example, plasma enhanced chemical vapor deposition (PECVD) can be employed to non-conformally deposit the dielectric material. A dielectric cap layer 90 containing rail-shaped cavities 89 is formed by the non-conformal deposition of the dielectric material. The dielectric cap layer 90 is formed in the laterally-extending trenches 87 and over the drain-select-level electrode strips 146. The dielectric cap layer 90 comprises a planar portion overlying the drain-select-level electrode strips 146 and downward-protruding rail portions filling the laterally-extending trenches and located between neighboring pairs of the drain-select-level electrode strips 146. In one embodiment, each of the downward-protruding rail portions comprises a cavity 89 that is free of any solid phase material or any liquid phase material (i.e., an air gap). The dielectric cap layer 90 is formed directly on sidewalls of the dielectric cylindrical segments 78'.

In one embodiment shown in FIG. 31C, vertical cross-sectional shapes of the rail-shaped cavities 89 can include arch shapes. In one embodiment, each cavity 89 within the downward-protruding rail portions includes an upper portion having a variable width that decreases with a vertical distance from the substrate 8. In one embodiment, each of the downward-protruding rail portions of the dielectric cap layer 90 includes a pair of sidewalls and a bottom portion located over a top surface of the dielectric etch stop layer 73. Due to the geometric shading of the deposited dielectric material during formation of the dielectric cap layer 90, the thickness of the bottom portion increases with a lateral distance from a proximal one of the pair of sidewalls. In one embodiment, each of the downward-protruding rail portions contacts two rows of dielectric cylindrical segments 78' that are arranged along the first horizontal direction hd1.

As shown in FIGS. 31B and 31C, drain-select-level electrode strips 146 can be patterned by photolithography and etching to remove parts of the drain-select-level electrode strips 146 located in the contact region 300 and the peripheral device region 200 during any of the steps described above. A planarization dielectric 92 can be formed in the contact region 300 and the peripheral device region 200 in locations from which the drain-select-level electrode strips 146 were removed. The dielectric cap layer 90 can then be formed over the planarization dielectric 92 located in the contact region 300 and the peripheral device region 200, and over the drain-select-level electrode strips 146 located in the memory array region 100.

Gate contact via structures 86 are formed through openings in the dielectric cap layer 90, the planarization dielectric 92 and the retro-stepped dielectric 65 in contact with the respective electrically conductive layers (e.g., word lines) 46 or drain-select-level electrode strips 146. Drain contact via structures 88 are formed through openings in the dielectric cap layer 90 to contact the drain regions 63. Bit lines (not shown) are then formed in electrical contact with the drain contact via structures 88.

Referring to all drawings of the present disclosure, a three-dimensional memory device is provided, which comprises an alternating stack of insulating layers 32 and word lines 46 located over a substrate 8, memory stack structures 55 extending through the alternating stack (32, 46) and comprising a respective vertical semiconductor channel 611 and a respective memory film 50, drain select gate electrodes (146, 152) located over the alternating stack, extending along a first horizontal direction, and laterally spaced apart along a second horizontal direction, and a dielectric cap layer 90 located between adjacent drain select gate electrodes. An air gap 89 is located between adjacent drain select gate electrodes in the dielectric cap layer 90.

In one embodiment, drain-select-level pillar structures 158 are located on a respective one of the memory stack structures 55, wherein each of the drain-select-level pillar structures 158 comprises a drain-select-level channel 613 contacting an underlying one of the memory stack structures 55.

In one embodiment, the dielectric cap layer 90 comprises a planar portion overlying the drain select gate electrodes (146, 152) (e.g., the drain-select-level electrode strips 146) and downward-protruding rail portions located between neighboring pairs of the drain select gate electrodes. Each of the downward-protruding rail portions comprises the air gap 89 which is a cavity that is free of any solid phase material or any liquid phase material.

In one embodiment, each cavity (i.e., air gap 89) within the downward-protruding rail portions is a laterally undulating cavity that generally extends along the first horizontal direction hd1 and has a lateral undulation along the second horizontal direction hd2. In one embodiment, each cavity within the downward-protruding rail portions includes an upper portion having a variable width that decreases with a vertical distance from the substrate 8.

In one embodiment, wherein each drain select gate electrode (146, 152) comprises a respective cylindrical gate electrode 152 which contacts a respective drain-select-level electrode strip 146. Thus, each cylindrical gate electrode 152 comprises both a portion of a respective drain select gate electrode and a portion of a respective drain-select-level pillar structure 158.

The exemplary structures can include a three-dimensional memory device. In one embodiment, the three-dimensional memory device comprises a monolithic three-dimensional NAND memory device. The substrate 8 can comprise a silicon substrate. The vertical NAND memory device can comprise an array of monolithic three-dimensional NAND strings over the silicon substrate. At least one memory cell (as embodied as a portion of a charge storage layer 54 at a level of a word-line-level electrically conductive layer 46) in a first device level of the array of monolithic three-dimensional NAND strings can be located over another memory cell (as embodied as another portion of the charge storage layer 54 at a level of another word-line-level electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The word-line-level electrically conductive layers 46 can comprise a plurality of control gate electrodes having a strip shape extending substantially parallel to the top surface of the substrate 8, e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (611, 613), wherein at least one end portion of each of the plurality of semiconductor channels (611, 613) extends substantially perpendicular to a top surface of the substrate 8 and comprising a respective one of the vertical semiconductor channels 611; and a plurality of charge storage elements (as embodied as portions of the memory films 50, i.e., portions of the charge storage layer 54). Each charge storage element can be located adjacent to a respective one of the plurality of semiconductor channels (611).

The air gaps 89 within the downward-protruding rail portions of the dielectric cap layer 90 have a dielectric constant of about 1.0, and thus, reduces capacitive coupling between neighboring pairs of drain-select-level electrode strips 146. Further, the downward-protruding rail portions of the dielectric cap layer 90 are self-aligned to the drain-select-level pillar structures 158. Thus, an on-pitch array of the drain-select-level pillar structures 158 can be employed in conjunction with an underlying on-pitch array of memory stack structures 55 to provide a compact periodic two-dimensional array of vertical NAND strings.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and word lines located over a substrate;
   memory stack structures extending through the alternating stack and comprising a respective vertical semiconductor channel and a respective memory film;
   drain select gate electrodes located over the alternating stack, extending along a first horizontal direction, and laterally spaced apart along a second horizontal direction;
   a dielectric cap layer located between adjacent drain select gate electrodes, wherein an air gap is located between adjacent drain select gate electrodes in the dielectric cap layer; and
   drain-select-level pillar structures located on a respective one of the memory stack structures;
   wherein:
   each of the drain-select-level pillar structures comprises a drain-select-level channel which contacts an underlying one of the memory stack structures;
   the dielectric cap layer comprises a planar portion overlying the drain select gate electrodes and downward-protruding rail portions located between neighboring pairs of the drain select gate electrodes; and
   each of the downward-protruding rail portions comprises the air gap which is a cavity that is free of any solid phase material or any liquid phase material.

2. The three-dimensional memory device of claim 1, wherein each cavity within the downward-protruding rail portions is a laterally undulating cavity that generally extends along the first horizontal direction and has a lateral undulation along the second horizontal direction.

3. The three-dimensional memory device of claim 2, wherein each cavity within the downward-protruding rail portions includes an upper portion having a variable width that decreases with a vertical distance from the substrate.

4. The three-dimensional memory device of claim 1, wherein each of the drain-select-level pillar structures comprises:
   a cylindrical gate dielectric laterally surrounding the drain-select-level channel; and
   a cylindrical gate electrode laterally surrounding the cylindrical gate dielectric.

5. The three-dimensional memory device of claim 4, wherein each drain select gate electrode comprises a respective cylindrical gate electrode which contacts a respective drain-select-level electrode strip.

6. The three-dimensional memory device of claim 5, wherein each of the downward-protruding rail portions contacts two rows of dielectric cylindrical segments that are arranged along the first horizontal direction.

7. The three-dimensional memory device of claim 6, wherein the cylindrical gate electrodes comprise:
   first cylindrical gate electrodes that contacts a respective one of the dielectric cylindrical segments on one side and contacting a respective drain-select-level electrode strip; and
   second cylindrical gate electrodes that do not contact any of the dielectric cylindrical segments and is laterally surrounded by the drain-select-level electrode strip.

8. The three-dimensional memory device of claim 5, wherein:
   each of the cylindrical gate electrodes comprises a doped semiconductor material; and
   each of the drain-select-level electrode strips comprises a metallic material.

9. The three-dimensional memory device of claim 5, further comprising a dielectric etch stop layer located between the alternating stack and the drain-select-level electrode strips, wherein each drain-select-level channel extends through a respective opening through the dielectric etch stop layer.

10. The three-dimensional memory device of claim 9, wherein each of the downward-protruding rail portions of the dielectric cap layer includes a pair of sidewalls and a bottom portion that contacts a top surface of the dielectric etch stop layer, wherein a thickness of the bottom portion increases with a lateral distance from a proximal one of the pair of sidewalls.

* * * * *